(12) United States Patent
Song

(10) Patent No.: US 11,452,245 B2
(45) Date of Patent: Sep. 20, 2022

(54) DISPLAY DEVICE

(71) Applicant: LG Display Co., Ltd., Seoul (KR)

(72) Inventor: JiHun Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 198 days.

(21) Appl. No.: 16/716,123

(22) Filed: Dec. 16, 2019

(65) Prior Publication Data

US 2020/0205301 A1     Jun. 25, 2020

(30) Foreign Application Priority Data

Dec. 19, 2018 (KR) ........................ 10-2018-0164844

(51) Int. Cl.
*H05K 7/20* (2006.01)
*H05K 5/00* (2006.01)
*H05K 5/03* (2006.01)
*G09G 3/20* (2006.01)

(52) U.S. Cl.
CPC .......... *H05K 7/20963* (2013.01); *G09G 3/20* (2013.01); *H05K 5/0017* (2013.01); *H05K 5/03* (2013.01); *G09G 2300/0439* (2013.01); *G09G 2380/02* (2013.01)

(58) Field of Classification Search
None
See application file for complete search history.

(56) References Cited

U.S. PATENT DOCUMENTS

| 10,424,229 | B2* | 9/2019 | Kim | ................. G02F 1/133308 |
| 10,684,652 | B2* | 6/2020 | Kim | ................. G02F 1/133528 |
| 2003/0048256 | A1* | 3/2003 | Salmon | ................. G06F 1/1615 345/168 |
| 2012/0204453 | A1* | 8/2012 | Jung | ...................... G09F 9/301 40/517 |
| 2014/0194165 | A1* | 7/2014 | Hwang | ................. G06F 1/1652 455/566 |
| 2016/0147261 | A1* | 5/2016 | Bohn | ................... H04B 1/3833 455/566 |
| 2016/0374228 | A1* | 12/2016 | Park | ........................ H05K 7/16 |
| 2017/0156220 | A1* | 6/2017 | Heo | ...................... H05K 5/0217 |
| 2017/0212556 | A1* | 7/2017 | Jovanovic | ............ G06F 1/1652 |
| 2017/0222178 | A1* | 8/2017 | Kang | ................. H01L 27/3276 |
| 2017/0373269 | A1* | 12/2017 | Seo | ..................... H01L 27/3223 |
| 2018/0014417 | A1* | 1/2018 | Seo | ....................... H05K 1/0203 |
| 2018/0070467 | A1 | 3/2018 | Kim et al. | |
| 2018/0103552 | A1* | 4/2018 | Seo | ....................... G06F 1/1624 |

(Continued)

FOREIGN PATENT DOCUMENTS

| CN | 102003641 A | 4/2011 |
| CN | 104882078 A | 9/2015 |

(Continued)

*Primary Examiner* — Xanthia C Cunningham
(74) *Attorney, Agent, or Firm* — Seed IP Law Group LLP

(57) ABSTRACT

A flexible, rollable display system includes a display and one or more cover components coupled thereto. The cover components include openings that, when the display is wound around a roller, reduce induced stresses and the likelihood of the display cracking. The roller may include a flat portion to accommodate a printed circuit board or other electronic components less flexible than the display. The cover component(s) may be formed of heat radiating material(s) to improve performance of the system.

30 Claims, 18 Drawing Sheets

(56) References Cited

U.S. PATENT DOCUMENTS

2019/0172377 A1\* 6/2019 Kim .................. G02F 1/133308
2020/0084305 A1 3/2020 Lin

FOREIGN PATENT DOCUMENTS

| CN | 105280668 A | 1/2016 |
| CN | 106251779 A | 12/2016 |
| CN | 106257569 A | 12/2016 |
| CN | 107452282 A | 12/2017 |
| EP | 3 173 855 A1 | 5/2017 |
| KR | 10-2016-0150253 A | 12/2016 |

\* cited by examiner

DISPLAY DEVICE

CROSS-REFERENCE TO RELATED APPLICATION

This application claims the priority of Korean Patent Application No. 10-2018-0164844 filed on Dec. 19, 2018, in the Korean Intellectual Property Office, the disclosure of which is incorporated herein by reference.

BACKGROUND

Technical Field

The present disclosure relates to a display device, and more particularly, to a rollable display device.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display unit and a wiring line on a flexible substrate such as plastic which is a flexible material so as to be capable of displaying images even though the display device is rolled is getting attention as a next generation display device.

BRIEF SUMMARY

Described herein is a display device which may improve the separation of a display panel and a flexible film caused when the display device is wound.

Also described herein is a display device which reduces a tensile stress generated in the flexible film when the display device is wound.

Also described herein is a display device which reduces a damage of the driving IC and the display panel caused by heat generated at the time of driving.

A display device may be summarized as comprising: a display panel including a plurality of pixels; a first cover coupled to the display panel; a second cover coupled to the first cover or the display panel; and a roller coupled to the second cover. The display device may further comprise: one or more flexible films electrically connected to the display panel; and one or more printed circuit boards electrically connected to the one or more flexible films; wherein the one or more printed circuit boards are fixed to the second cover. The first cover may include a first support area and a first malleable area adjacent to the first support area, wherein the display panel is coupled to the first malleable area; and the second cover may at least partially overlap the first malleable area of the first cover on a surface of the first cover opposite to the display panel.

The display device may further comprise: a first adhesive member bonding the display panel to the first cover; and a second adhesive member bonding the first cover to the second cover. The display device may further comprise: one or more flexible films electrically connected to the display panel in a bonding area of the display panel; wherein the first adhesive member spans an entire area between the display panel, other than the bonding area of the display panel, and the first cover. The second adhesive member may be located between the first cover and the second cover and may not overlap the bonding area. The first cover may include a first support area and a first malleable area adjacent to the first support area, wherein the display panel is coupled to the first malleable area; the display panel may include a display area and a non-display area outside of the display area, and the second cover may at least partially overlap the non-display area of the display panel on a surface of the display panel opposite to the first cover.

The non-display area may include a bonding area and one or more flexible films may be bonded to the bonding area, and the second cover may overlap the bonding area. The display device may further comprise: a first adhesive member that attaches the display panel to the first cover; wherein the first adhesive member and the first cover are coupled to a portion of the display panel outside the bonding area of the non-display area of the display panel. The display device may further comprise: a second adhesive member that attaches the display panel to the second cover; wherein the second adhesive member is an adhesive layer that includes metal or ceramic particles. The non-display area may further include a driving circuit area adjacent to the bonding area, wherein the driving circuit area includes a driving circuit; and the second cover may overlap the driving circuit area. The second cover may include a second support area fixed to the roller and a second malleable area adjacent to the second support area; and the second malleable area may include a plurality of openings. The display device may further comprise: a head bar fixed to the first cover.

A display device may be summarized as comprising: a display panel configured to display images; one or more flexible films electrically connected to the display panel; a first cover attached to a rear surface of the display panel; a second cover attached to a rear surface of the first cover or to a front surface of the display panel, wherein the second cover overlaps a location where the display panel and the flexible film are connected; and a roller configured to wind and unwind the display panel, the first cover, and the second cover. The display panel may include a display area and a non-display area at the outside of the display area; the non-display area may include a bonding area; the flexible film may be bonded to the non-display area of the display panel; and the second cover overlaps the bonding area.

The display device may further comprise: a first adhesive member that attaches the display panel to the first cover; and a second adhesive member that attaches the second cover to the first cover; wherein the second cover is coupled to a surface of the first cover opposite to the display panel. The second adhesive member may not contact the bonding area. The display device may further comprise: a first adhesive member that attaches the display panel to the first cover; and a second adhesive member that attaches the display panel to the second cover; wherein the second cover is coupled to a surface of the display panel opposite to the first cover. The second adhesive member may be an adhesive layer that includes heat radiating particles. The second cover may be formed of a metal material selected from a group of metal materials consisting of: aluminum, copper, nickel, an alloy including aluminum, an alloy including copper, an alloy including nickel, and an alloy including silver.

A rollable display device may be summarized as comprising: a rollable display panel; a first cover coupled to a rear surface of the rollable display panel, wherein the first cover includes a malleable portion of the first cover, the malleable portion of the first cover including a first plurality of openings; a printed circuit board; and a second cover; wherein the second cover overlaps the printed circuit board. The second cover may overlap the printed circuit board along an axis extending from a front end of the rollable display device to a rear end of the rollable display device. The second cover may include a first malleable portion of the second cover including a second plurality of openings, a second malleable portion of the second cover including a third plurality of openings, and a support portion located between the first malleable portion of the second cover and the second malleable portion of the second cover, wherein the printed circuit board is attached to the support portion of the second cover. The malleable portion of the first cover may overlap the first malleable portion of the second cover.

The rollable display panel may be attached to the malleable portion of the first cover. The first cover may be configured to structurally support the rollable display panel and the second cover may be configured to structurally support the rollable display panel and the printed circuit board. The second cover may be formed of a heat-radiating material. The heat-radiating material may include a material selected from the group consisting of: aluminum, copper, nickel, and silver. The rollable display panel may include a bonding portion of the rollable display panel where a flexible film is bonded to the rollable display panel, and the second cover may be coupled to a front surface of the bonding portion of the rollable display panel. The second cover may be coupled to the rollable display panel by an adhesive including particles of a heat radiating material.

Other detailed matters of the exemplary embodiments are included in the detailed description and the drawings.

According to the present disclosure, it is possible to improve separation of the flexible film caused by a force by which the display panel is supported while winding the display device.

According to the present disclosure, the flexible film may be wound by the second cover so that the tensile stress applied to the flexible film may be minimized.

According to the present disclosure, a second cover having a heat radiating function may be disposed to overlap the non-display area of the display panel to easily radiate heat generated at the time of driving the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
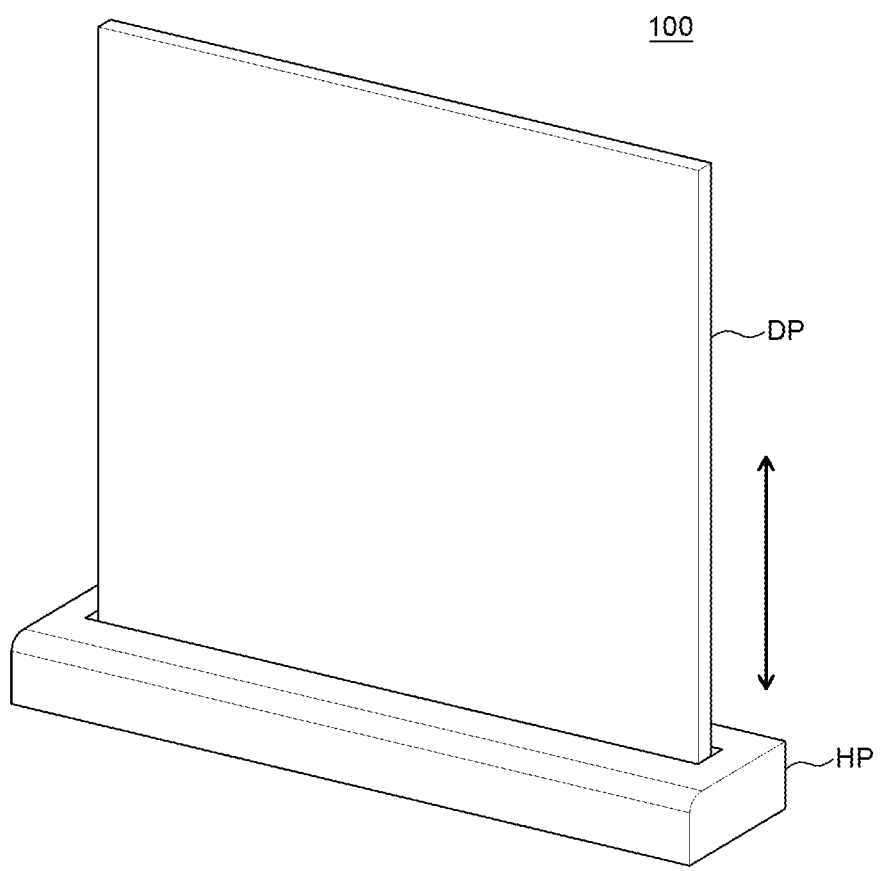
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Display Device-Rollable Display Device

First, a rollable display device may also be referred to as a display device which is capable of displaying images even though the display device is rolled. The rollable display device may have a high flexibility as compared with a general display device of the related art. Depending on whether to use a rollable display device, a shape of the rollable display device may be freely varied. Specifically, when the rollable display device is not used, the rollable display device is rolled to be stored with a reduced volume. In contrast, when the rollable display device is used, the rolled rollable display device is unrolled to be used.

Figure 1B:
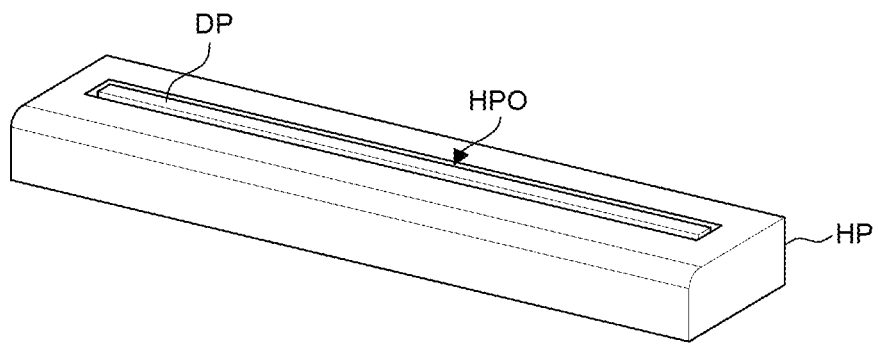

FIGS. 1A and 1B are perspective views of a display device according to an exemplary embodiment of the present disclosure; Referring to FIGS. 1A and 1B, a display device 100 according to an exemplary embodiment of the present disclosure includes a display, which may be referred to herein as a "display unit DP," and a housing, which may be referred to herein as a "housing unit HP."

The display unit DP is a configuration for displaying images to a user and for example, in the display unit, a display element and a circuit, a wiring line, and a component for driving the display element may be disposed. In this case, since the display device 100 according to an exemplary embodiment of the present disclosure is a rollable display device 100, the display unit DP may be configured to be wound and unwound. For example, the display unit DP may be formed of a display panel, a first cover, and a second cover each having flexibility to be wound or unwound. The display unit DP will be described below in more detail with reference to FIGS. 5 to 7B.

The housing unit HP is a case in which the display unit DP is accommodated. The display unit DP may be wound to be accommodated in the housing unit HP and the display unit DP may be unwound to be disposed outside the housing unit HP.

The housing unit HP may have an opening HPO so that the display unit DP moves to the inside and the outside of the housing unit HP. The display unit DP may move in a vertical direction through the opening HPO of the housing unit HP.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a lift, a lift assembly, or a lift system, which may be referred to herein as a "driving unit MP," which winds or unwinds the display unit DP, is disposed.

Driving Unit

Figure 2:
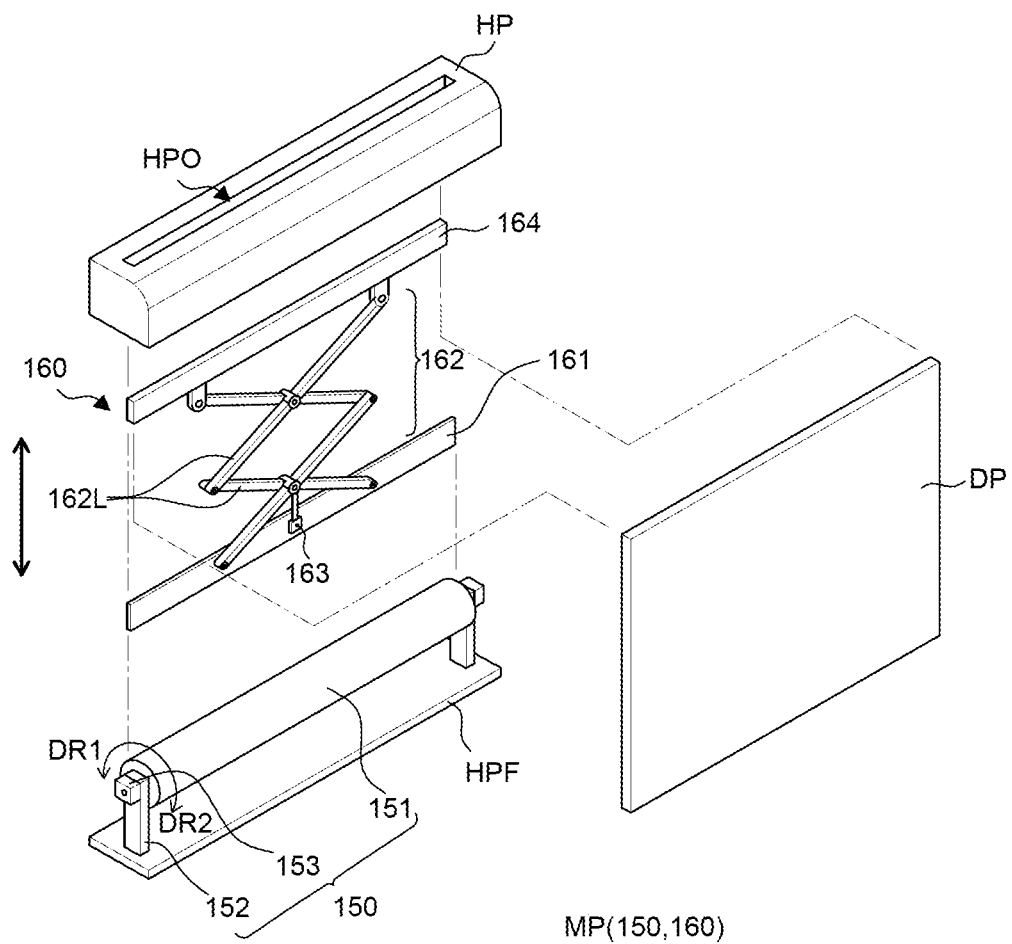
FIG. 2 is an exploded perspective view of a display device according to an exemplary embodiment of the present disclosure.
Figure 3:
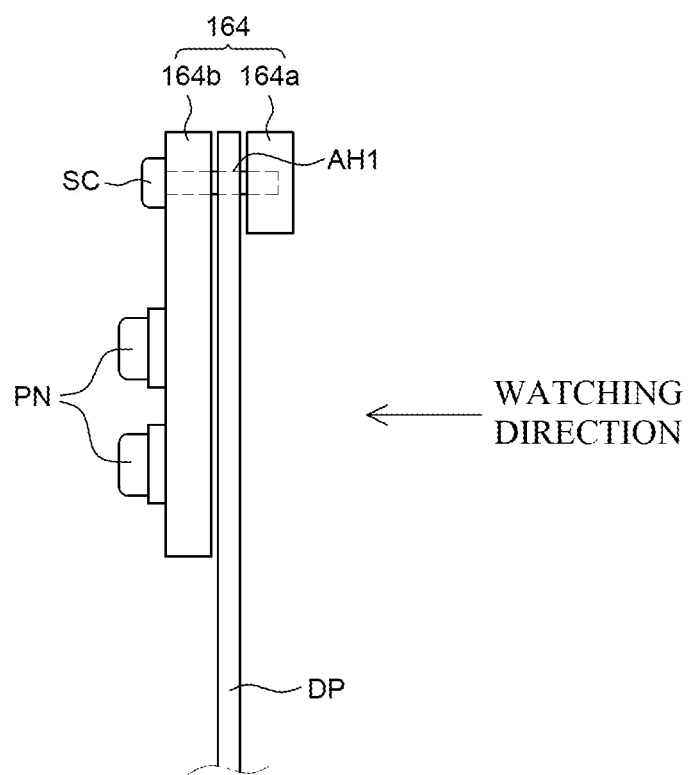
FIG. 3 is a schematic cross-sectional view for explaining a head bar and a display unit of a display device according to an exemplary embodiment of the present disclosure.
Figure 4:
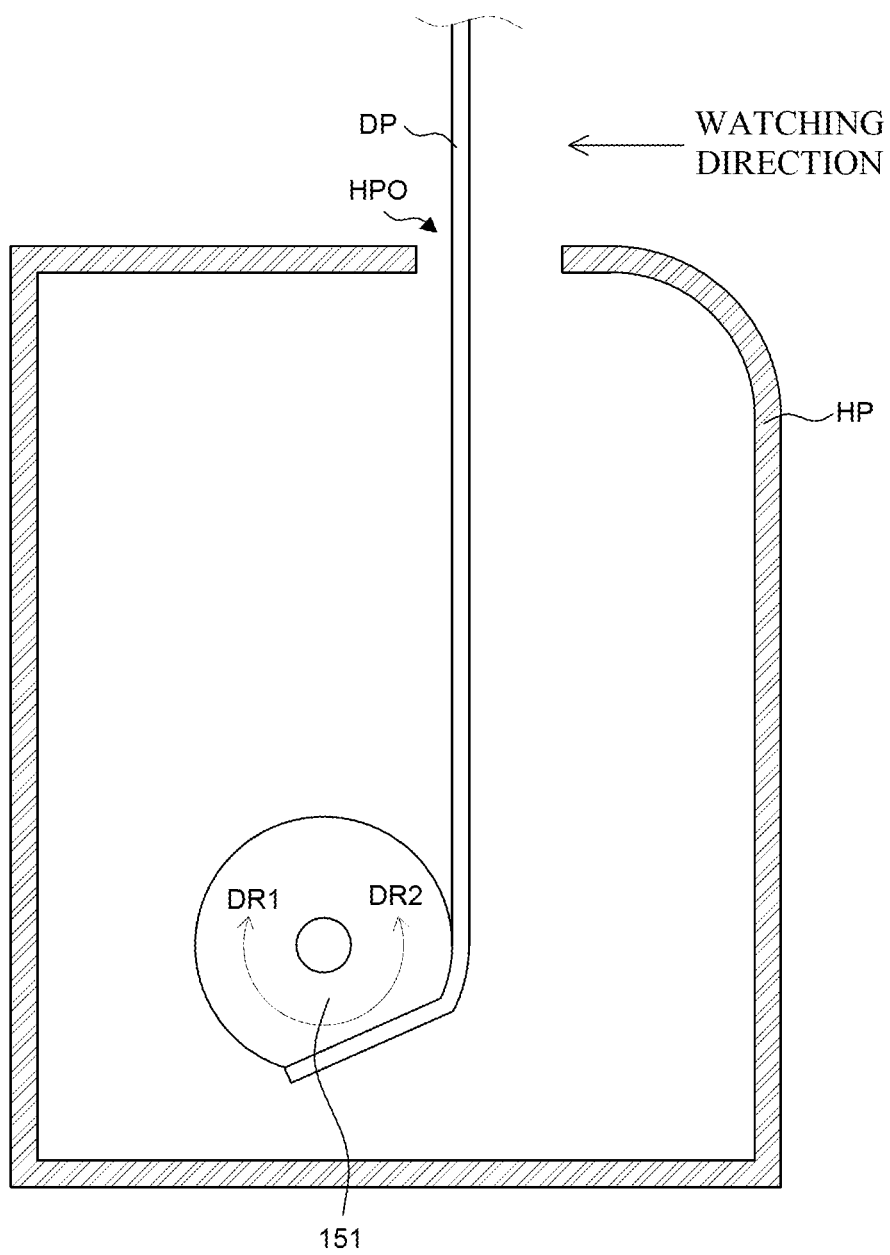
FIG. 4 is a cross-sectional view of a display device according to an exemplary embodiment of the present disclosure.

FIG. 2 is an exploded perspective view of a display device according to an exemplary embodiment of the present disclosure. FIG. 3 is a schematic cross-sectional view for explaining a head bar and a display unit of a display device according to an exemplary embodiment of the present disclosure. FIG. 4 is a cross-sectional view of a display device according to an exemplary embodiment of the present disclosure. FIG. 4 is a schematic cross-sectional view for explaining a roller 151 and a display unit DP of a display device 100 according to an exemplary embodiment of the present disclosure. For the convenience of description, FIG. 3 illustrates only a head bar 164 and a display unit DP and FIG. 4 illustrates only a housing unit HP, a roller 151, and a display unit DP.

First, referring to FIG. 2, a driving unit MP includes an actuation system or a driver, which may be referred to herein as a "roller unit 150," and a pantograph or a scissors mechanism, which may be referred to herein as a "lifting unit 160."

A roller unit 150 winds or unwinds the display unit DP fixed to the roller unit 150 while rotating in a first direction DR1 or a second direction DR2. The roller unit 150 includes a roller 151, a pair of posts, columns, supports, or uprights, which may be referred to herein as a "roller support unit 152," and a rotational actuator, which may be referred to herein as a "roller rotating unit 153."

The roller 151 is a member around which the display unit DP is wound. The roller 151 may be, for example, formed to have a cylindrical shape. A lower edge of the display unit DP may be fixed to the roller 151. When the roller 151 rotates, the display unit DP which is fixed to the roller 151 through the lower edge may be wound around the roller 151. In contrast, when the roller 151 rotates in an opposite direction, the display unit DP which is wound around the roller 151 may be unwound from the roller 151. The roller 151 may be formed of a metal material or a plastic material having rigidity.

The roller support units 152 support the roller 151 at both sides of the roller 151. Specifically, the roller support units 152 are disposed on a bottom surface HPF of the housing unit HP. Upper side surfaces of the roller support units 152 are coupled to both ends of the roller 151. Therefore, the roller support units 152 may support the roller 151 to be spaced apart from the bottom surface HPF of the housing unit HP. In this case, the roller 151 may be rotatably coupled to the roller support units 152.

The roller rotating units 153 may rotate the roller 151 in the first direction DR1 or the second direction DR2. Roller rotating units 153 may be disposed in a pair of roller support units 152. For example, the roller rotating units 153 may be rotary motors which transmit a torque to the roller 151, but are not limited thereto.

The lifting unit 160 moves the display unit DP in a vertical direction in accordance with the driving of the roller unit 150. The lifting unit 160 includes a bottom crossbar, which may be referred to herein as a "link support unit 161," a pantograph including a plurality of interconnected mechanical linkages, which may be referred to herein as a "link unit 162," a linear actuator, which may be referred to herein as a "link lifting unit 163," and a head bar 164.

The link support unit 161 supports the link unit 162 and the link lifting unit 163. Specifically, the link support unit 161 may support the link unit 162 and the display unit DP which move in the vertical direction so as not to collide with a boundary of the opening HPO of the housing unit HP. The link support unit 161 may support the link unit 162 and the display unit DP to move only in a vertical direction without moving in forward and backward directions.

The link unit 162 may include a plurality of links 162L which are hinged with each other. The plurality of links 162L is rotatably hinged to each other to move in the vertical direction by the link lifting unit 163. When the link unit 162 moves in the vertical direction, the plurality of links 162L rotates to be far away from each other or close to each other. Detailed description thereof will be made with reference to FIG. 4.

The link lifting unit 163 moves the link unit 162 in the vertical direction. The link lifting unit 163 rotates the plurality of links 162L of the link unit 162 to be close to each other or rotates the plurality of links 162L to be far away from each other. The link lifting unit 163 lifts or lowers the link unit 162 to lift or lower the display unit DP connected to the link unit 162.

In this case, the link lifting unit 163 is driven to be synchronized with the roller rotating unit 153 so that the roller unit 150 and the lifting unit 160 may simultaneously operate. For example, when the display unit DP is switched from a fully unwound state to a fully wound state, the roller unit 150 operates to wind the display unit DP around the roller 151 and simultaneously with this, the lifting unit 160 operates to rotate the plurality of links 162L of the link unit 162 to lower the display unit DP. Further, when the display unit DP is switched from a fully wound state to a fully unwound state, the roller unit 150 operates to unwind the display unit DP from the roller 151 and simultaneously with this, the lifting unit 160 operates to rotate the plurality of links 162L of the link unit 162 to lift the display unit DP.

The head bar 164 of the lifting unit 160 is fixed to an uppermost end of the display unit DP. The head bar 164 is coupled to the link unit 162 to move the display unit DP in the vertical direction in accordance with the rotation of the plurality of links 162L of the link unit 162. That is, the display unit DP may move in a vertical direction by the head bar 164, the link unit 162, and the link lifting unit 163.

Referring to FIG. 3, the head bar 164 is disposed at the uppermost end of the display unit DP so as to enclose a front surface and a rear surface of the display unit DP.

The head bar 164 includes a first head bar 164a and a second head bar 164b. The first head bar 164a covers the front surface of the display unit DP. The first head bar 164a covers only a portion of the front surface which is adjacent to an uppermost edge of the display unit DP so as not to hide an image displayed on the front surface of the display unit DP.

The second head bar 164b covers the rear surface of the display unit DP. The second head bar 164b covers a portion of the rear surface which is adjacent to the uppermost edge of the display unit DP. However, since no image is displayed on the rear surface of the display unit DP, the second head bar 164b may overlap the display unit DP more than the first head bar 164a.

In order to fasten the display unit DP with the first head bar 164a and the second head bar 164b, a first fastening hole AH1 may be formed in the display unit DP. A screw SC penetrates the first fastening hole AH1 to fasten the first head bar 164a, the display unit DP, and the second head bar 164b.

Pem nuts PN to which the link unit 162 of the lifting unit 160 is fastened are disposed in the second head bar 164b. The second head bar 164b and the link unit 162 of the lifting unit 160 may be fastened with each other by the pem nuts PN. Therefore, when the link unit 162 of the lifting unit 160 moves in the vertical direction, the second head bar 164b fastened with the link unit 162 and the first head bar 164a and the display unit DP fastened with the second head bar 164b move together in the vertical direction.

In the meantime, even though in FIG. 3, it is illustrated that the first head bar 164a and the second head bar 164b have a linear shape, the shapes of the first head bar 164a and the second head bar 164b may be changed in various forms and are not limited thereto.

Hereinafter, a driving operation of the driving unit MP will be described in detail with reference to FIG. 4 together.

Referring to FIG. 4 together, a lower edge of the display unit DP is coupled to the roller 151. When the roller 151 rotates in the first direction DR1, that is, a clockwise direction, by the roller rotating unit 153, the display unit DP may be wound around the roller 151 so that a rear surface of the display unit DP is in close contact with a surface of the roller 151.

In contrast, when the roller 151 rotates in the second direction DR2, that is, a counter clockwise direction, by the roller rotating unit 153, the display unit DP wound around the roller 151 is unwound from the roller 151 to be disposed at the outside of the housing unit HP.

In some exemplary embodiments, a driving unit MP having a different structure other than the above-described driving unit MP may be applied to the display device 100. That is, as long as the display unit DP is wound and unwound, the above-described configuration of the roller unit 150 and the lifting unit 160 may be modified, some configuration may be omitted, or another configuration may be added.

Display Unit

Figure 5:
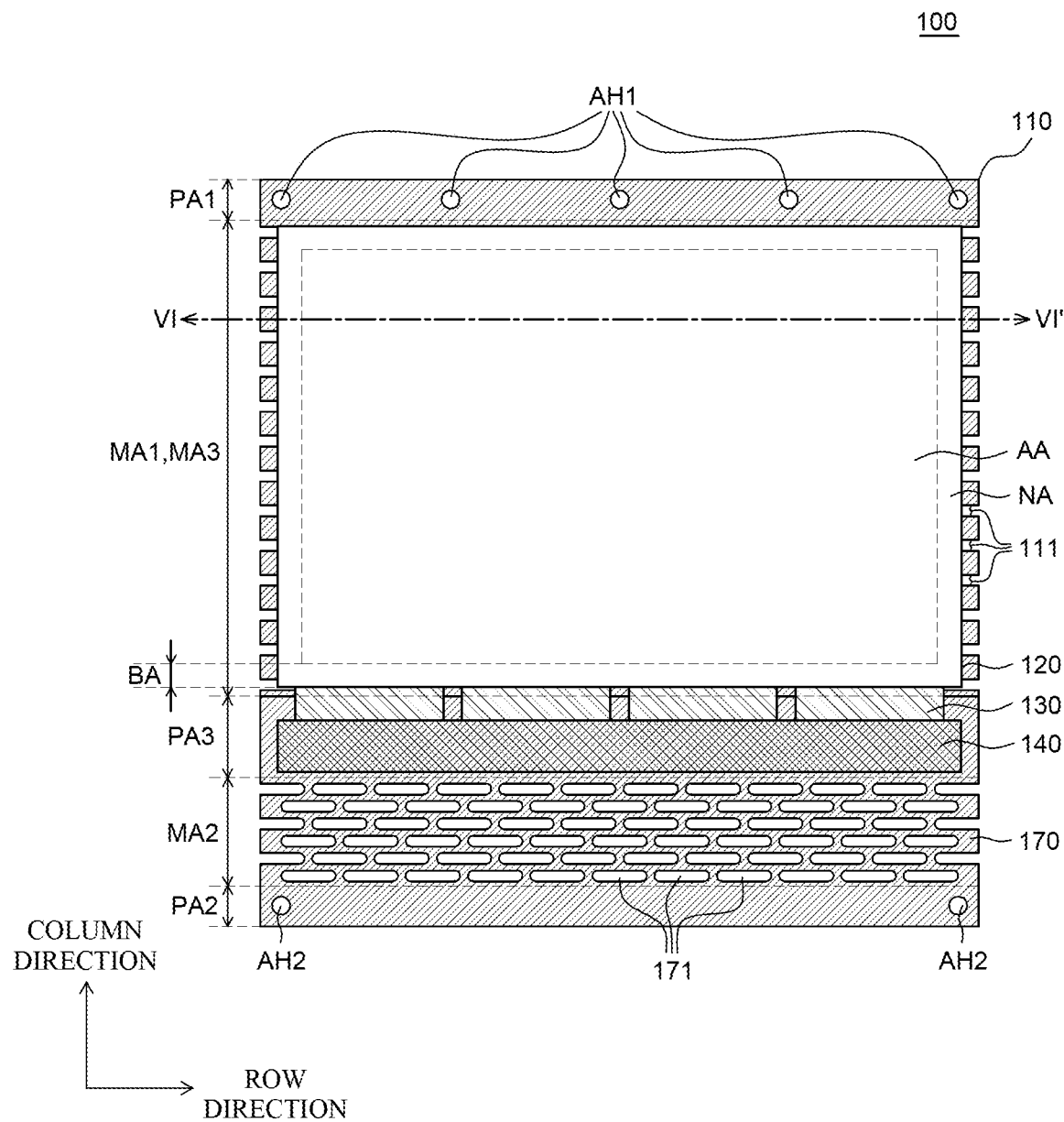
FIG. 5 is a plan view of a display device according to an exemplary embodiment of the present disclosure.
Figure 6:
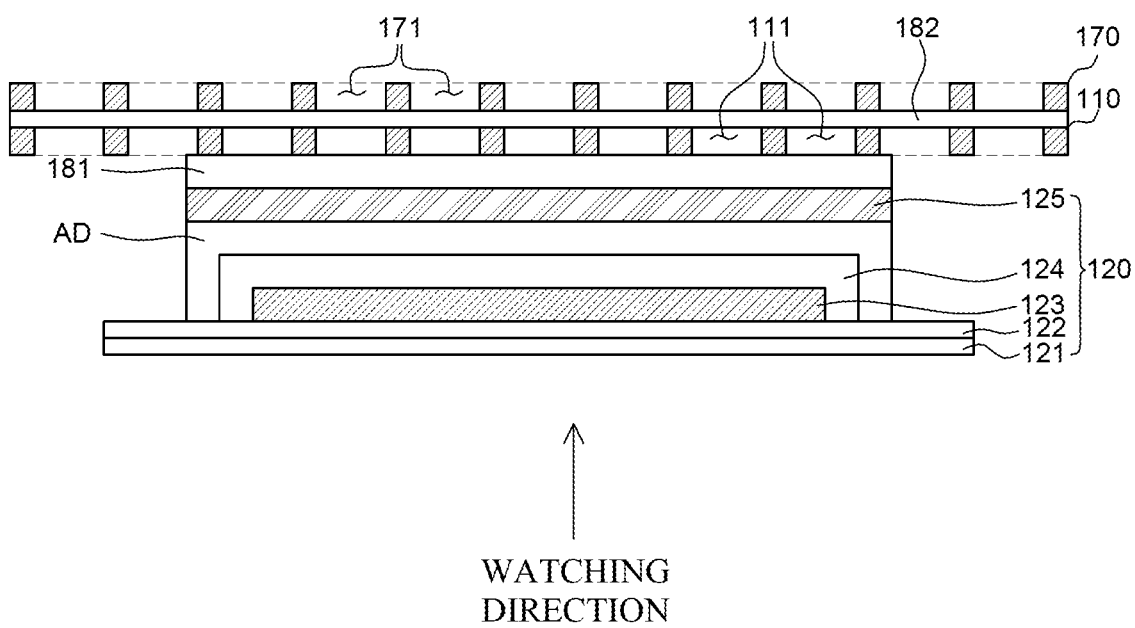
FIG. 6 is a cross-sectional view taken along the line VI-VI' of FIG. 5.

FIG. 5 is a plan view of a display unit of a display device according to an exemplary embodiment of the present disclosure. FIG. 6 is a cross-sectional view taken along the line VI-VI' of FIG. 5. In FIG. 5, for the convenience of description, the roller unit 150 and the lifting unit 160 are not illustrated.

Referring to FIG. 5, the display unit DP includes a first cover 110, a display panel 120, a flexible film 130, a printed circuit board 140, and a second cover 170.

The display panel 120 is a panel for displaying images to a user. The display panel 120 may include a display element which displays images, a driving element which drives the display element, and wiring lines which transmit various signals to the display element and the driving element. The display element may be defined in different ways depending on a type of the display panel 120. For example, when the display panel 120 is an organic light emitting display panel, the display panel may be an organic light emitting diode which includes an anode, an organic light emitting layer, and a cathode. For example, when the display panel 120 is a liquid crystal display panel, the display panel may be a liquid crystal display element. Hereinafter, even though the display panel 120 is assumed as an organic light emitting display panel, the display panel 120 is not limited to the organic light emitting display panel. Further, since the display device 100 according to an exemplary embodiment of the present disclosure is a rollable display device, the display panel 120 may be implemented as a flexible display panel to be wound around or unwound from the roller 151.

The display panel 120 includes a display area AA and a non-display area NA.

The display area AA is an area where images are displayed in the display panel 120. In the display area AA, a plurality of sub pixels which configures the plurality of pixels and a circuit for driving the plurality of sub pixels may be disposed. The plurality of sub pixels is minimum units which configure the display area AA and a display element may be disposed in each of the plurality of sub pixels. The plurality of sub pixels may configure a pixel. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be formed of a thin film transistor, a storage capacitor, a gate line, a data line, and the like, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and circuits of the display area AA or a driving IC such as a gate driver IC or a data driver IC may be disposed, but the non-display area is not limited thereto.

Referring to FIG. 5, the display panel 120 may include a bonding area BA. The bonding area BA is an area disposed at one side of the display area AA of the display panel 120 among the non-display areas NA and defined as an area where the flexible film 130 is bonded. In the bonding area BA, various pads for bonding the flexible film 130 and wiring lines for connecting various components disposed in the display area AA may be disposed, but the present disclosure is not limited thereto.

The flexible film 130 is a film in which various components are disposed on a base film having a malleability. Specifically, the flexible film 130 is a film which supplies a signal to the plurality of sub pixels and the circuits of the display area AA and is electrically connected to the display panel 120. The flexible film 130 is disposed at one end of the non-display area NA of the display panel 120 to supply a power voltage, a data voltage, or the like, to the plurality of sub pixels and the circuits of the display area AA. For example, the flexible film 130 may be disposed in the bonding area BA of the non-display area NA to be bonded to the bonding area BA. Even though four flexible films 130 are illustrated in FIG. 5, the number of flexible films 130 may vary depending on the design and is not limited thereto.

In the meantime, for example, a driving IC such as a gate driver IC or a data driver IC may be disposed on the flexible film 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the flexible film 130 by a chip on film technique, but is not limited thereto.

The printed circuit board 140 is disposed at one end of the flexible film 130 to be connected to the flexible film 130. The printed circuit board 140 is a component which supplies signals to the driving IC. The printed circuit board 140 supplies various signals such as a driving signal or a data signal to the driving IC. For example, a data driver which generates data signals may be mounted in the printed circuit board 140 and the generated data signal may be supplied to the plurality of sub pixels and the circuit of the display panel 120 through the flexible film 130. In the meantime, even though one printed circuit board 140 is illustrated in FIG. 5, the number of printed circuit boards 140 may vary depending on the design and is not limited thereto.

The first cover 110 is disposed on a rear surface of the display panel 120 to support the display panel 120. Therefore, the first cover 110 may be larger than the size of the display panel 120 and protect the display panel 120 from the outside. Even though the first cover 110 is formed of a material having a rigidity, at least a portion of the first cover 110 may have a flexibility to be wound or unwound together with the display panel 120. For example, the first cover 110 may be formed of a metal material such as steel use stainless or invar or plastic. However, if the material of the first cover 110 satisfies physical conditions such as a thermal strain amount, a radius of curvature, and a rigidity, the material may be diversely changed, and is not limited thereto.

The second cover 170 is disposed on rear surfaces of the display panel 120, the flexible film 130, and the printed circuit board 140 to support the display panel 120, the flexible film 130, and the printed circuit board 140. Therefore, the second cover 170 may be larger than the size of the display panel 120 and protect other components of the display unit DP from the outside. The second cover 170 may be formed of the same material as the first cover 110, but is not limited thereto. The material of the second cover 170 may be diversely changed if the material satisfies physical conditions such as a thermal strain amount, a radius of curvature, and a rigidity.

Referring to FIG. 6, the display panel 120 includes a substrate 121, a buffer layer 122, an emissive layer including a plurality of organic light emitting diodes, which may be referred to herein as a "pixel unit 123," an encapsulation layer 124, and an encapsulation substrate 125.

The substrate 121 which is a base member for supporting various components of the display panel 120 may be configured by an insulating material. The substrate 121 may be formed of a material having a flexibility to allow the display panel 120 to be wound or unwound and for example, may be formed of a plastic material such as polyimide PI.

The buffer layer 122 suppress moisture and/or oxygen which is permeated from the outside of the substrate 121 from being diffused. The buffer layer 122 may be configured by a single layer or a double layer of silicon oxide SiOx and silicon nitride SiNx, but is not limited thereto.

The pixel unit 123 includes a plurality of organic light emitting diodes and a circuit for driving the plurality of organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. In this case, when the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from the group consisting of metals such as magnesium (Mg), silver (Ag), and aluminum (Al), and an alloy thereof, but is not limited thereto.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed behind the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectivity.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit may be formed of a thin film transistor, a storage capacitor, a gate line, a data line, a power line, and the like, but it may vary in various forms depending on the design of the display device 100.

The encapsulation layer 124 which covers the pixel unit 123 is disposed on the pixel unit 123. The encapsulation layer 124 closely seals the organic light emitting diode of the pixel unit 123. The encapsulation layer 124 may protect the organic light emitting diode of the pixel unit 123 from moisture, oxygen, and impacts of the outside. The encapsulation layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy-based or acrylic-based polymer, but they are not limited thereto.

The encapsulation substrate 125 is disposed on the encapsulation layer 124. The encapsulation substrate 125 protects the organic light emitting diode of the pixel unit 123 together with the encapsulation layer 124. The encapsulation substrate 125 may protect the organic light emitting diode of the pixel unit 123 from moisture, oxygen, impacts, and the like of the outside. The encapsulation substrate 125 may be formed of a metal material, which has a high corrosion resistance and is easily processed in the form of foil or thin film, such as aluminum (Al), nickel (Ni), chromium (Cr), and an alloy material of iron (Fe) and nickel. Therefore, as the encapsulation substrate 125 is formed of a metal material, the encapsulation substrate 125 may be implemented as an ultra-thin film and have a high resistance against external impacts and scratches.

An adhesive layer AD may be disposed between the encapsulation layer 124 and the encapsulation substrate 125. The adhesive layer AD may bond the encapsulation layer 124 and the encapsulation substrate 125. The adhesive layer AD is formed of a material having adhesiveness and may be a thermosetting or natural curable type adhesive. For example, the adhesive layer AD may be formed of an optical clear adhesive (OCA), a pressure sensitive adhesive (PSA), or the like, but is not limited thereto.

In the meantime, the adhesive layer AD may be disposed to enclose the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the adhesive layer AD. The adhesive layer AD may protect the organic light emitting diode of the pixel unit 123 from moisture, oxygen, impacts, and the like of the outside together with the encapsulation layer 124 and the encapsulation substrate 125. In this case, the adhesive layer AD may further include an absorbent. The absorbent may be particles having hygroscopicity and absorb moisture, oxygen, and the like from the outside to minimize permeation of the moisture and oxygen into the pixel unit 123.

The first cover 110 is disposed on the encapsulation substrate 125. The first cover 110 is disposed to be in contact with the encapsulation substrate 125 of the display panel 120 to protect the display panel 120. In order to protect the display panel 120, the first cover 110 may be formed of a material having a rigidity.

In the meantime, the first cover 110 may include a plurality of openings 111. The plurality of openings 111 may allow the first cover 110 to have flexibility. The plurality of openings 111 may be flexibly deformed and allow the first cover 110 to be wound around the roller 151 or unwound from the roller 151 together with the display panel 120. Detailed description thereof will be made with reference to FIG. 7A.

A first adhesive member 181 is disposed between the encapsulation substrate 125 and the first cover 110. The first adhesive member 181 bonds the encapsulation substrate 125 and the first cover 110. The first adhesive member 181 is formed of a material having adhesiveness and may be a thermosetting or natural curable type adhesive. For example, the first adhesive member 181 may be formed of an optical clear adhesive (OCA), a pressure sensitive adhesive (PSA), or the like but is not limited thereto.

Even though in FIG. 6, it is illustrated that the plurality of openings 111 of the first cover 110 is not filled with the first adhesive member 181, the first adhesive member 181 may be filled in a portion or all of the plurality of openings 111 of the first cover 110. If the first adhesive member 181 is filled inside the plurality of openings 111 of the first cover 110, a contact area between the first adhesive member 181 and the first cover 110 is increased so that a separation phenomenon may be avoided.

A second cover 170 is disposed on the first cover 110. The second cover 170 is disposed to be in contact with the first cover 110 to protect the display panel 120. In order to protect the display panel 120, the second cover 170 may be formed of a material having a rigidity.

In the meantime, the second cover 170 may include a plurality of openings 171. The plurality of openings 171 may allow the second cover 170 to have flexibility. The plurality of openings 171 may be flexibly deformed and allow the second cover 170 to be wound around the roller 151 or unwound from the roller 151 together with the display panel 120. The plurality of openings 171 of the second cover 170 may perform the same function as the plurality of openings 111 of the first cover 110 and details thereof will be described below with reference to FIG. 7B.

The second adhesive member 182 is disposed between the first cover 110 and the second cover 170. The second adhesive member 182 bonds the first cover 110 and the second cover 170. The second adhesive member 182 is formed of a material having adhesiveness and may be a thermosetting or natural curable type adhesive. For example, the second adhesive member 182 may be formed of an optical clear adhesive (OCA), a pressure sensitive adhesive (PSA), or the like, but is not limited thereto.

Even though in FIG. 6, it is illustrated that the plurality of openings 111 of the first cover 110 and the plurality of openings 171 of the second cover 170 are not filled with the second adhesive member 182, the second adhesive member 182 may fill a portion or all of the plurality of openings 111 of the first cover 110 and the plurality of openings 171 of the second cover 170. When the second adhesive member 182 fills insides of the plurality of openings 111 of the first cover 110 and the plurality of openings 171 of the second cover 170, the contact area between the second adhesive member 182 and the first cover 110 and the contact area between the second adhesive member 182 and the second cover 170 are increased to avoid the separation phenomenon.

Even though not illustrated in FIG. 6, a translucent film may be further disposed on a rear surface of the substrate 121. The translucent film may perform a function of protecting a front surface of the display panel 120 or minimizing the reflection of external light incident onto the display panel 120. For example, the translucent film may be at least one of a polyethyleneterephthalate (PET) film, a cyclo olefin polymer (COP) film, an anti-reflection film, a polarizer film, and a transmittance controllable film, but is not limited thereto.

Hereinafter, the first cover 110 and the second cover 170 will be described in more detail with reference to FIGS. 7A and 7B.

First Cover and Second Cover

Figure 7A:
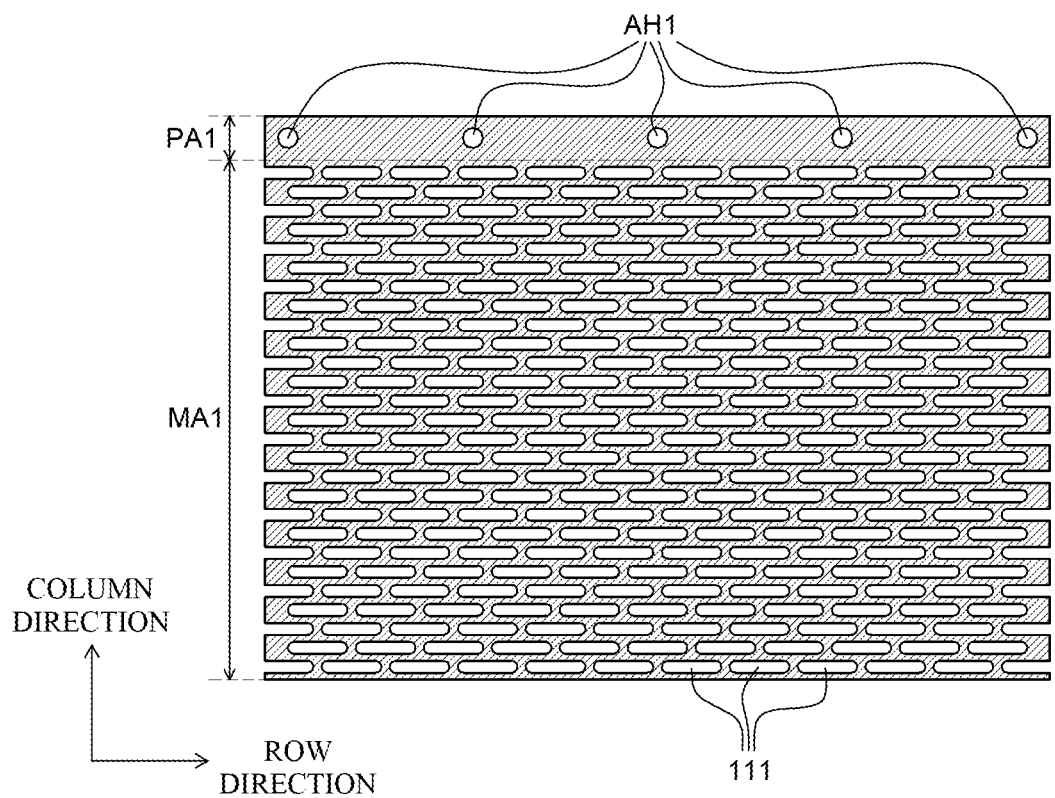
FIG. 7A is a plan view of a first cover of a display device according to an exemplary embodiment of the present disclosure.

FIG. 7A is a plan view of a first cover of a display device according to an exemplary embodiment of the present disclosure. FIG. 7B is a plan view of a second cover of a display device according to an exemplary embodiment of the present disclosure.

Referring to FIG. 7A, the first cover 110 includes a first support area PA1 and a first malleable area MA1. The first support area PA1 is an area where a plurality of openings 111 is not disposed and the first malleable area MA1 is an area where a plurality of openings 111 is disposed. Specifically, the first support area PA1 and the first malleable area MA1 are sequentially disposed from the uppermost end of the first cover 110.

The first support area PA1 of the first cover 110 is an uppermost area of the first cover 110 and is fastened with the head bar 164. The first support area PA1 includes a first fastening hole AH1 to be fastened with the head bar 164. As described in detail with reference to FIG. 3, screws SC which pass through the head bar 164 and the first fastening holes AH1 are disposed to fasten the head bar 164 with the first support area PA1 of the first cover 110. Further, as the first support area PA1 is fastened with the head bar 164, when the link unit 162 which is fastened with the head bar 164 is lifted or lowered, the first cover 110 is also lifted and lowered together with the display panel 120 which is attached to the first cover 110. Even though five first fastening holes AH1 are illustrated in FIG. 7A, the number of first fastening holes AH1 is not limited thereto. Further, even though it is described that the first cover 110 is fastened with the head bar 164 using the first fastening holes AH1 in FIG. 7A, it is not limited thereto and the first cover 110 and the head bar 164 may be fixed to each other without using a separate fastening hole.

The first malleable area MA1 is an area extending from the first support area PA1. The first malleable area MA1 is an area in which a plurality of openings 111 is disposed and the display panel 120 is attached.

When the display unit DP is wound around the roller 151 to be accommodated in the housing unit HP, the first malleable area MA1 of the first cover 110 and the lower end portion and a center portion of the display panel 120 which are attached to the first malleable area MA1 may be wound around the roller 151. In this case, in the first malleable area MA1 of the first cover 110, the plurality of openings 111 is formed so that the first malleable area MA1 may have a high flexibility and may be easily wound around the roller 151 together with the display panel 120.

Figure 7B:
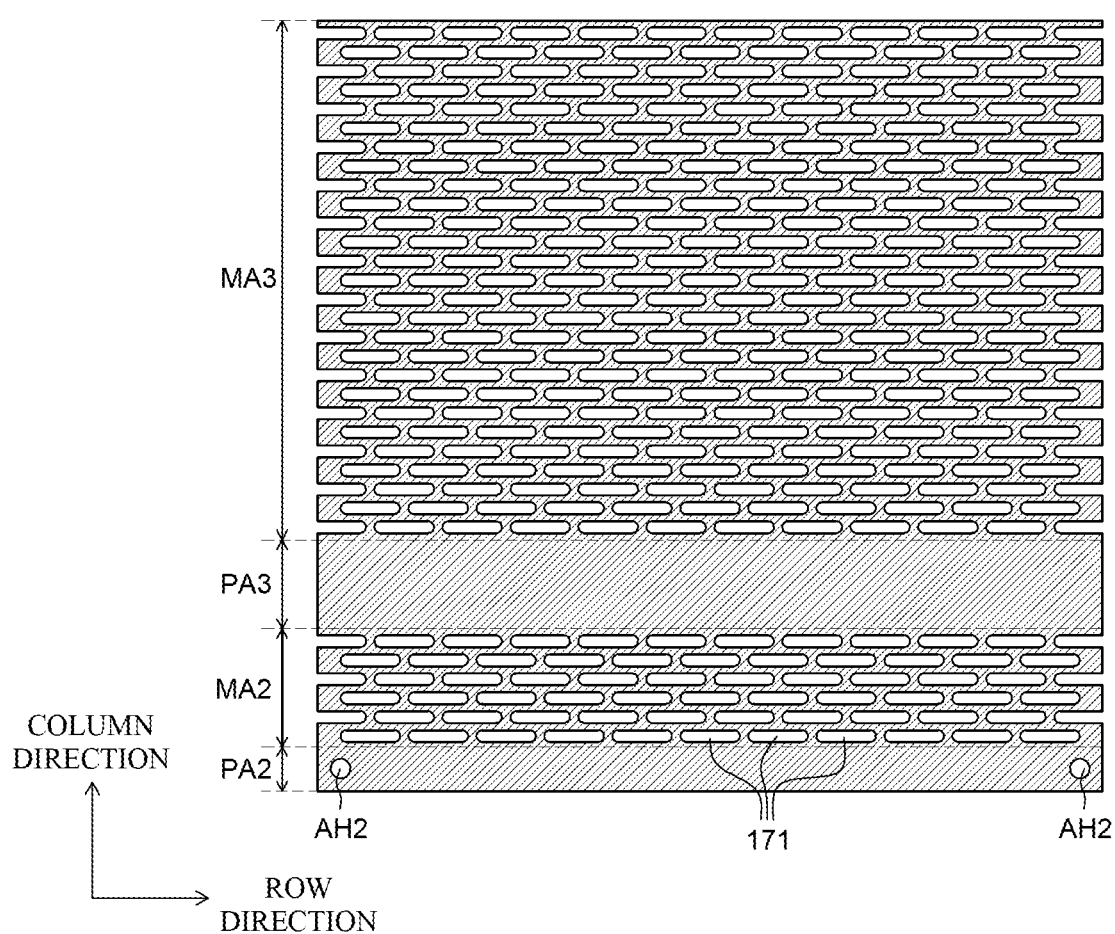
FIG. 7B is a plan view of a second cover of a display device according to an exemplary embodiment of the present disclosure.

Referring to FIG. 7B, the second cover 170 includes a plurality of support areas PA2 and PA3 and a plurality of malleable areas MA2 and MA3. The plurality of support areas PA2 and PA3 are areas where a plurality of openings 171 are not disposed and the plurality of malleable areas MA2 and MA3 are areas where a plurality of openings 171 are disposed. Specifically, the second cover 170 may be formed such that the third malleable area MA3, the third support area PA3, the second malleable area MA2, and the second support area PA2 are sequentially disposed from the uppermost end of the second cover 170.

The third malleable area MA3 is an uppermost area of the second cover 170 and at least partially overlaps the display panel 120 and the first malleable area MA1 of the first cover 110. A plurality of openings 171 is disposed in the third malleable area MA3.

The third support area PA3 is an area extending from the third malleable area MA3 to a lower side of the second cover 170. A flexible film 130 which is connected to one end of the display panel 120 and a printed circuit board 140 are attached to the third support area PA3.

In order to protect the flexible film 130 and the printed circuit board 140, the third support area PA3 may allow the flexible film 130 and the printed circuit board 140 to be wound around the roller 851 in a planar shape, rather than a curved shape. Further, a portion of the roller 151 may be formed to be flat, corresponding to the third support area PA3.

The second malleable area MA2 is an area extending from the third support area PA3 to a lower side of the second cover 170. Further, a plurality of openings 171 is disposed in the second malleable area MA2.

The second malleable area MA2 extends to dispose the display area AA of the display panel 120 at the outside of the housing unit HP. For example, when the second cover 170 and the display panel 120 are fully unwound, an area from the second support area PA2 of the second cover 170 fixed to the roller 151 to the third support area PA3 to which the flexible film 130 and the printed circuit board 140 are attached may be disposed in the housing unit HP. The first malleable area MA1 of the first cover 110 to which the display panel 120 is attached and the third malleable area MA3 of the second cover 170 may be disposed at the outside of the housing unit HP. In this case, when a total length in the column direction illustrated in FIG. 5 of the second support area PA2, the second malleable area MA2, and the third support area PA3 is smaller than a length in the column direction illustrated in FIG. 5 from an end of the second support area PA2 opposite to the second malleable area MA2 to the opening HPO of the housing unit HP, a portion of the first malleable area MA1 of the first cover 110 to which the display panel 120 is attached may be disposed in the housing unit HP. Therefore, since a portion of the lower end of the display area AA of the display panel 120 may be disposed in the housing unit HP, it may be difficult to watch images. Therefore, the total length in the column direction illustrated in FIG. 5 of the second support area PA2, the second malleable area MA2, and the third support area PA3 may be designed to be equal to the length in the column direction illustrated in FIG. 5 from an end of the second support area PA2 opposite to the second malleable area MA2 to the opening HPO of the housing unit HP.

The second support area PA2 of the second cover 170 is a lowermost area of the second cover 170 and is fastened with the roller 151. The second support area PA2 may include second fastening holes AH2 to be fastened with the roller 151. For example, screws SC which pass through the roller 151 and the second fastening holes AH2 are disposed to fasten the roller 151 and the second support area PA2 of the second cover 170 with each other. As the second support area PA2 is fastened with the roller 151, the second cover 170 may be wound around or unwound from the roller 151 by the rotation of the roller 151. Even though two second fastening holes AH2 are illustrated in FIG. 7, the number of second fastening holes AH2 is not limited thereto. Further, even though it is described that the second cover 170 is fastened with the roller 151 using the second fastening holes AH2 in FIG. 7B, it is not limited thereto and the second cover 170 and the roller 151 may be fastened with each other without using a separate fastening hole.

In the meantime, the plurality of openings 111 is disposed in the first malleable area MA1 of the first cover 110. When the display unit DP is wound or unwound, the plurality of openings 111 may be deformed by a stress which is applied to the display unit DP. Specifically, when the display unit DP is wound or unwound, the first malleable area MA1 of the first cover 110 may be deformed as the plurality of openings 111 contracts or expands. Further, as the plurality of openings 111 contracts or expands, a slip phenomenon of the display panel 120 disposed on the first malleable area MA1 of the first cover 110 is minimized so that the stress which is applied to the display panel 120 may be minimized.

When the display panel 120 and the first cover 110 are wound, a difference between a length of the display panel 120 which is wound around the roller 151 and a length of the first cover 110 which is wound around the roller 151 may be caused due to the difference of radii of curvature of the display panel 120 and the first cover 110. For example, when the first cover 110 and the display panel 120 are wound around the roller 151, a length of the first cover 110 required for wound around the roller 151 once may be different from a length of the display panel 120 required for being wound around the roller 151 once. That is, since the display panel 120 is disposed outer than the first cover 110 with respect to the roller 151, a length of the display panel 120 required to be wound around the roller 151 once may be larger than a length of the first cover 110 required to be wound around the roller 151 once. As described above, the winding lengths of the first cover 110 and the display panel 120 are different from each other due to the difference of radii of curvature at the time of winding the display unit DP and the display panel 120 attached to the first cover 110 may slide to move from its original position. In this case, a phenomenon that the display panel slides from the first cover 110 due to the stress and the difference of radii of curvature caused by the winding may be defined as a slip phenomenon. When the slip phenomenon is excessively increased, the display panel 120 may be detached from the first cover 110 or failures such as cracks may be caused.

In this case, in the display device 100 according to an exemplary embodiment of the present disclosure, even though the display unit DP is wound or unwound and a stress is applied to the display unit DP, the plurality of openings 111 of the first cover 110 is flexibly deformed to relieve the stress applied to the first cover 110 and the display panel 120. For example, when the first cover 110 and the display panel 120 are wound around the roller 151, a stress which deforms the first cover 110 and the display panel 120 in a vertical direction may be applied. In this case, the plurality of openings 111 of the first cover 110 may extend in a vertical direction of the first cover 110 and the length of the first cover 110 may be flexibly deformed. Therefore, the difference in lengths of the first cover 110 and the display panel 120 caused by the difference in radii of curvature during the process of winding the first cover 110 and the display panel 120 may be compensated by the plurality of openings 111 of the first cover 110. Further, the plurality of openings 111 is deformed during the process of winding the first cover 110 and the display panel 120 so that a stress which is applied to the display panel 120 from the first cover 110 may also be relieved.

Further, in the display device 100 according to an exemplary embodiment of the present disclosure, even though the second cover 170 is wound or unwound and a stress is applied to the second cover 170, the plurality of openings 171 of the second cover 170 is flexibly deformed to relieve the stress applied to the second cover 170. For example, when the second cover 170 is wound around the roller 151, a stress which deforms the second cover 170 in a vertical direction may be applied. In this case, the plurality of openings 171 of the second cover 170 may extend in a vertical direction of the second cover 170 and the length of the second cover 170 may be flexibly deformed. Therefore, the plurality of openings 171 is deformed during the process of winding the second cover 170 to relieve the stress applied to the second cover 110.

Referring to FIGS. 7A and 7B, the plurality of openings 111 of the first cover 110 and the plurality of openings 171 of the second cover 170 may be disposed to be staggered with respect to the plurality of openings 111 and 171 in adjacent rows. Specifically, a center of the plurality of openings 111 and 171 disposed in an odd-numbered row and a center of the plurality of openings 111 and 171 disposed in an even-numbered row may be staggered. However, the arrangement of the plurality of openings 111 and 171 illustrated in FIGS. 7A and 7B is just an example, and is not limited thereto.

In this case, in the first support area PA1 and the second support area PA2, the plurality of openings 111 and 171 as formed in the malleable area MA is not formed. Specifically, the first support area PA1 and the second support area PA2 which are fixed to the head bar 164 and the roller 151, respectively, need to be more rigid than the malleable area MA. That is, in each of the first support area PA1 and the second support area PA2, only the first fastening holes AH1 and the second fastening holes AH2 are formed, but the plurality of openings 111 and 171 as formed in the malleable area MA is not formed. Further, the first fastening holes AH1 and the second fastening holes AH2 have different shapes from that of the plurality of openings 111.

In the display device 100 according to an exemplary embodiment of the present disclosure, the first cover 110 and the second cover 170 with the plurality of openings 111 and 171 formed therein is disposed on the rear surface of the display panel 120 to support and protect the display panel 120. The first cover 110 and the second cover 170 are formed of a metal material to have rigidity and the plurality of openings 111 and 171 is formed in the malleable area MA of the first cover 110 and the second cover 170 which overlaps the display panel 120 so that the flexibility of the first cover 110 and the second cover 170 may be improved. Therefore, in a fully unwound state in which the display unit DP of the display device 100 is disposed at the outside of the housing unit HP, the first cover 110 and the second cover 170 which are formed of a rigid material to have a high rigidity may support the display panel 120 to be flatly spread. In contrast, in a fully wound state in which the display unit DP of the display device 100 is accommodated in the housing unit HP, the first cover 110 and the second cover 170 having a high flexibility due to the plurality of openings 111 is wound around the roller 151 together with the display panel 120 to be accommodated.

Further, in the display device 100 according to an exemplary embodiment of the present disclosure, a width of the plurality of openings 111 and 171 in the row direction is adjusted so that the first cover 110 and the second cover 170 have a flexibility and thus the stress applied when the first cover 110 and the second cover 170 are wound may be relieved. Specifically, when the first cover 110, the second cover 170, and the display panel 120 are wound around the roller, the first cover 110 and the second cover 170 may be bent in the column direction and the stress may be applied so that the plurality of openings 111 and 171 extends in the column direction. A width of the plurality of openings 111 and 171 in the row direction is formed to be large so that when the first cover 110, the second cover 170, and the display panel 120 are wound around the roller 151, the plurality of openings 111 and 171 may easily extend in the column direction. Further, the stress applied to the first cover 110 and the second cover 170 may be relieved. Therefore, in the display device 100 according to an exemplary embodiment of the present disclosure, a width of the plurality of openings 111 and 171 in the row direction is adjusted so that the flexibility of the first cover 110 and the second cover 170 may be increased. Further, the first cover 110, the second cover 170, and the display panel 120 may be easily wound around the roller 151. Furthermore, the plurality of openings 111 and 171 expands in the column direction to relieve the stress applied to the first cover 110, the second cover 170, and the display panel 120 so that the breakage of the display panel 120 may be reduced.

Figure 8:
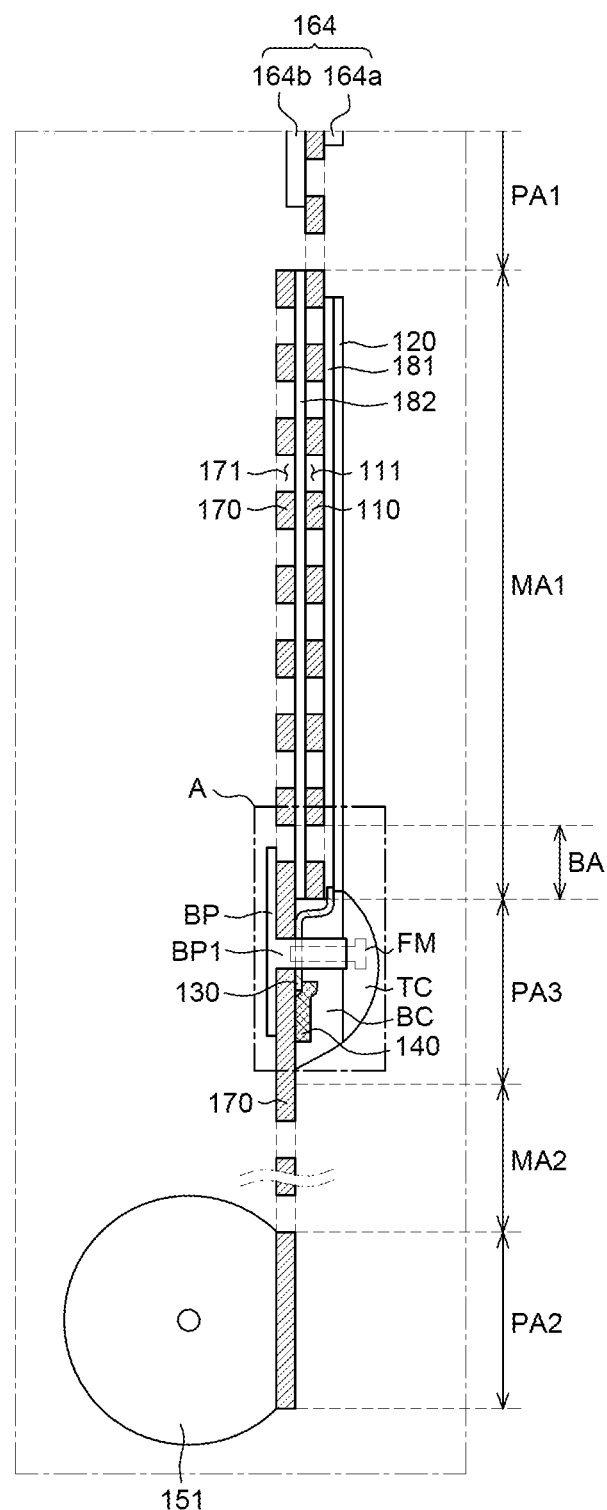
FIG. 8 is a cross-sectional view of a display device according to an exemplary embodiment of the present disclosure.
Figure 9:
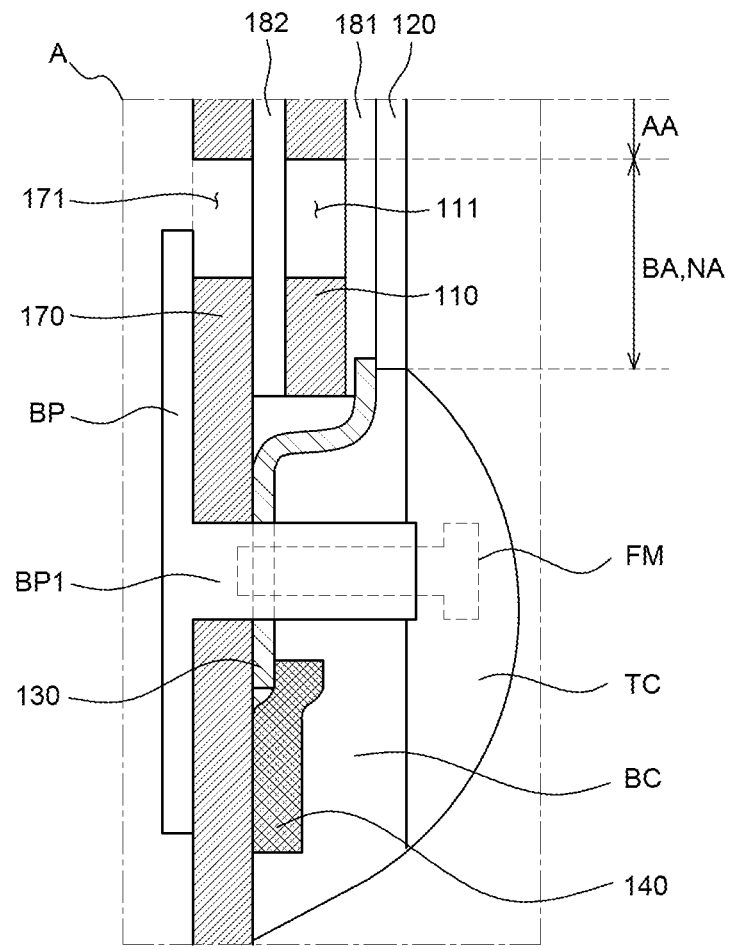
FIG. 9 is an enlarged view of an area A of FIG. 8 of the present disclosure.

FIG. 8 is a cross-sectional view of a display device according to an exemplary embodiment of the present disclosure. FIG. 9 is an enlarged view of an area A of FIG. 8.

Referring to FIG. 8, the display panel 120 is disposed on one surface of the first cover 110 and the second cover 170 is disposed on an opposite surface of the surface of the first cover 110 on which the display panel 120 is disposed. The second cover 170 may be disposed to overlap the first malleable area MA1 of the first cover 110 on the opposite surface of the surface of the first cover 110 on which the display panel 120 is disposed.

Referring to FIG. 8, the first cover 110 includes a first support area PA1 and a first malleable area MA1. Further, the second cover 170 includes a third malleable area MA3, a third support area PA3, a second malleable area MA2, and a second support area PA2. In this case, the third malleable area MA3 of the second cover 170 may be disposed to overlap the first malleable area MA1 of the first cover 110. In this case, even though the third malleable area MA3 may be defined to have the same size as the first malleable area MA1, it is not limited thereto and the third malleable area MA3 may be disposed to overlap only a portion of the first malleable area MA1.

Referring to FIG. 8, the display device 100 may further include a mechanism for fixing the printed circuit board 140. The mechanism is disposed in the third support area PA3 of the second cover 170 to fix the printed circuit board 140 to the second cover 170. That is, the mechanism may fix the printed circuit board 140 disposed in the third support area PA3 to the second cover 170.

Referring to FIG. 8, the mechanism may include a base plate BP, a rear cover BC, and a front cover TC.

The base plate BP is disposed on a rear surface of the second cover 170. The base plate BP includes a fixing protrusion BP1 protruding toward the front cover TC from one surface. Therefore, the fixing protrusion BP1 passes through the second cover 170, the rear cover BC, and the front cover TC to be fastened with a fixing member FM. A structure to which the fixing member FM is fastened may be disposed in the fixing protrusion BP1. For example, the fixing protrusion BP1 may be formed with a structure like a pem nut and a screw thread is formed in the fixing protrusion BP1 so that the fixing member FM may be fastened with the fixing protrusion BP1 by the screw thread in the fixing protrusion BP1.

The rear cover BC is disposed on the second cover 170. The rear cover BC may be fixed to the base plate BP as the fixing protrusion BP1 of the base plate BP passes therethrough. That is, on the rear cover BC, a hole through which the fixing protrusion BP1 of the base plate BP passes may be disposed. Further, the flexible film 130 and the printed circuit board 140 are disposed on the rear cover BC to fix the flexible film 130 and the printed circuit board 140.

The front cover TC is disposed in front of the rear cover BC. The front cover TC is disposed to cover the rear cover BC and the flexible film 130 and the printed circuit board 140 disposed on the rear cover BC to protect the flexible film 130 and the printed circuit board 140. In the front cover TC, a hole into which the fixing protrusion BP1 of the base plate BP passes and the fixing member FM is inserted may be disposed. Further, when the display device is wound, the front cover TC is disposed on a flat portion of the roller 151 to have a curved outer circumferential surface so that a shape formed by the roller 151 and the front cover TC is substantially a circular shape.

Referring to FIG. 8, the head bar 164 is disposed at an upper end of the display device 100 to be fixed to the first cover 110. That is, the head bar 164 is fixed to the first support area PA1 of the first cover 110. However, the present disclosure is not limited thereto. When the first cover 110 does not include the first support area PA1 and the second cover 110 includes the first support area PA1, the head bar 164 may be fixed to the second cover 170.

Referring to FIG. 8, a portion of the flexible film 130 is disposed on the first cover 110 and the other portion is disposed on the second cover 170. Specifically, a portion of the flexible film 130 may be bonded to the bonding area BA of the display panel 120 disposed on the first cover 110 and the other portion may be disposed in the third support area PA3 of the second cover 170.

Referring to FIGS. 8 and 9, the first adhesive member 181 is disposed between the display panel 120 and the first cover 110 to bond the display panel 120 and the first cover 110. The first adhesive member 181 may be disposed in the entire area between the display panel 120 and the first cover 110. However, the present disclosure is not limited thereto and the first adhesive member 181 may be disposed in an area excluding the bonding area BA between the display panel 120 and the first cover 110.

Referring to FIGS. 8 and 9, the second adhesive member 182 is disposed between the first cover 110 and the second cover 170 to bond the first cover 110 and the second cover 170. The second adhesive member 182 may be disposed in the entire area between the first cover 110 and the second cover 170.

Generally, in the rollable display device, a metallic cover is disposed on a rear surface of the display panel to support the display panel. When such a rollable display device is wound, a force is generated to maintain a flat state of the display panel while the cover fixed to the roller is rolled around the roller and a tensile stress may be generated in the display panel during the winding process. Therefore, the display panel may be separated from the cover during the winding process and the flexible film bonded to the display panel may also be separated. Further, even though the display panel and the flexible film are not separated, a pad of the display panel or a pad of the flexible film disposed in the bonding area in which the flexible film is bonded may be damaged by a force of the display panel for maintaining the flat state during the winding process and the tensile stress applied to the display panel and the flexible film. Further, various inorganic layers and wiring lines disposed in the bonding area may also be damaged. As described above, when the pads, wiring lines, or the like, disposed in the bonding area are damaged, a signal is not normally supplied to the display device so that a driving failure of the display device may be caused.

However, in the display device 100 according to an exemplary embodiment of the present disclosure, the first malleable area MA1 of the first cover 110 is disposed to have a size corresponding to the display panel 120. Therefore, the separation of the display panel 120 and the flexible film 130 caused when the display device 100 is wound may be reduced. Specifically, in the display device 100 according to an exemplary embodiment of the present disclosure, the second cover 170 is fixed to the roller 151 so that the second cover 170 is primarily wound around the roller 151. In this case, the display panel 120 is not directly attached to the second cover 170, but is attached to the first cover 110 and the first cover 110 is attached to the second cover 170. Therefore, during the process of winding the display panel 120, a force for maintaining the flat state of the first cover 110 is generated. When the force is excessively generated, an end of the first cover 110 corresponding to the bonding area BA may be separated from the second cover 170. However, since the first cover 110 supports the display panel 120, the display panel 120 maintains a stable state and thus a possibility of separation of the flexible film 130 from the display panel 120 may be very low. Further, since the first cover 110 supports the display panel 120, the pad of the display panel 120 or the pad of the flexible film 130, various wiring lines, and the inorganic layers disposed in the bonding area BA may not be damaged. Therefore, in the display device 100 according to an exemplary embodiment of the present disclosure, the separation of the flexible film 130 from the display panel 120 may be minimized and the damage of the pads, the wiring lines, the inorganic layers, and the like, disposed in the bonding area BA is suppressed. As a result, it is possible to solve the problem of the driving failure of the display device 100.

Improvement of Rolling Property

Figure 10:
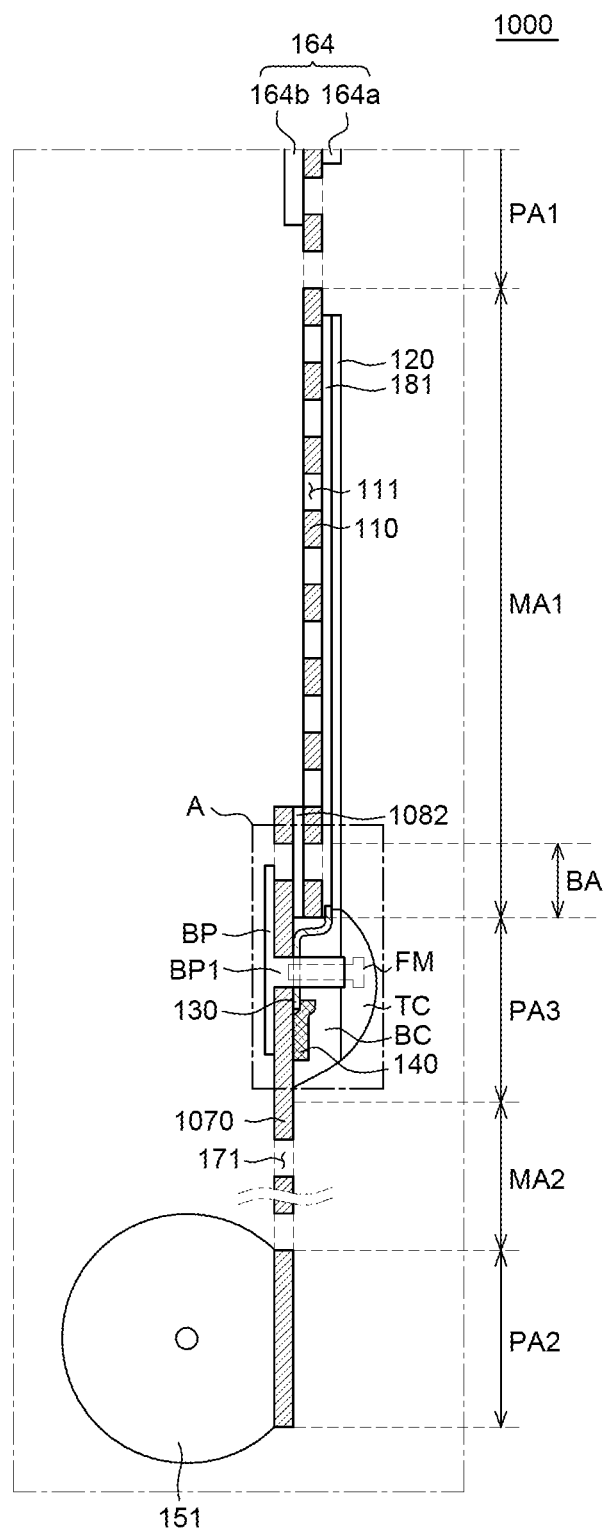
FIG. 10 is a cross-sectional view of a display device according to another exemplary embodiment of the present disclosure.

FIG. 10 is a cross-sectional view of a display device according to another exemplary embodiment of the present disclosure. The only difference between the display device 1000 of FIG. 10 and the display device 100 of FIGS. 1 to 9 is a second cover 1070 and a second adhesive member 1082, but other configuration is substantially the same, so that a redundant description will be omitted.

Referring to FIG. 10, the second cover 1070 is disposed to at least partially overlap the first cover 110. Specifically, the second cover 1070 extends from the third support area PA3 toward the head bar 164 to overlap a portion of the first malleable area MA1 rather than the entire first malleable area MA1 of the first cover 110. Therefore, the second adhesive member 1082 may also be disposed only in a portion where the first cover 110 and the second cover 1070 overlap.

In the display device 1000 according to another exemplary embodiment of the present disclosure, the second cover 1070 is disposed to only partially overlap the first malleable area MA1 of the first cover 110, thereby improving the rolling property of the display device 1000. Specifically, since the first cover 110 and the second cover 1070 are formed of a rigid material such as a metal, when the display device 1000 is wound, a stress is generated in the first cover 110 and the second cover 1070, which results in the damage of the first cover 110 and the second cover 1070 or the display panel 120. Therefore, the portion of the second cover 1070 which overlaps the first cover 110 is disposed to be minimized, that is, the second cover 1070 and the first cover 110 overlap only in an area enough to be fixed using the second adhesive member 1082. Therefore, the stress generated in the second cover 1070 when the display device 1000 is wound is reduced and thus the rolling property of the display device 1000 may be improved.

Adjust Area where Second Adhesive Member is Disposed

Figure 11:
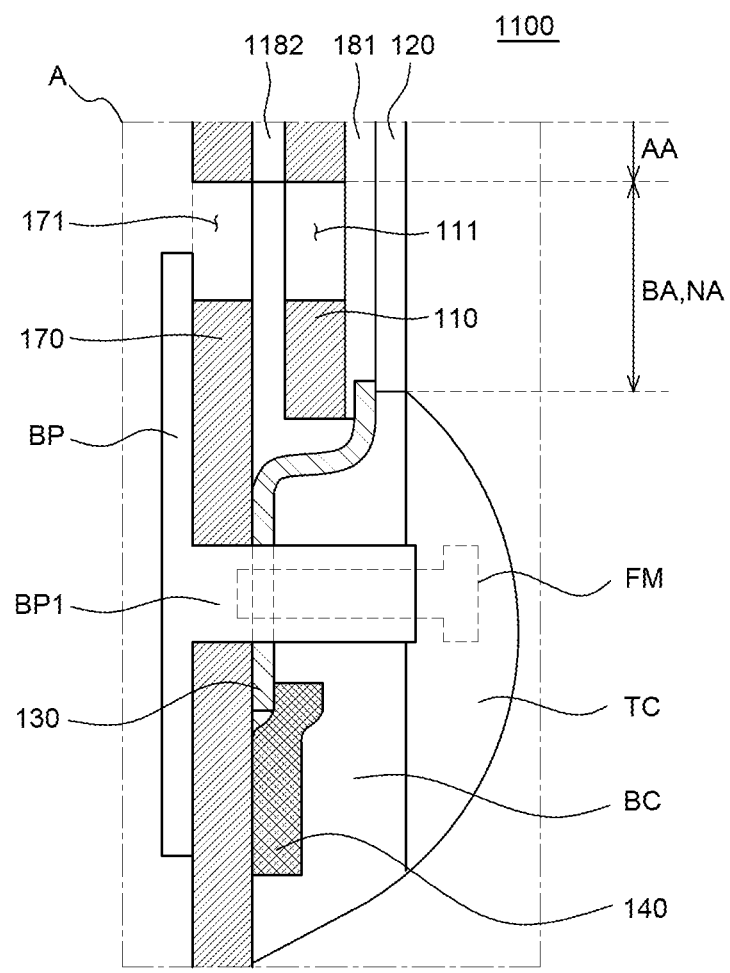
FIG. 11 is an enlarged view of a display device according to another exemplary embodiment of the present disclosure.

FIG. 11 is an enlarged view of a display device according to another exemplary embodiment of the present disclosure. The only difference between a display device 1100 of FIG.

11 and the display device 100 of FIGS. 1 to 9 is a second adhesive member 1182, but other configuration is substantially the same, so that a redundant description will be omitted.

Referring to FIG. 11, the second adhesive member 1182 may be disposed in an area excluding an area overlapping an area where the flexible film 130 is disposed, between the first cover 110 and the second cover 170. That is, the second adhesive member 1182 may be disposed in the area between the first cover 110 and the second cover 170 excluding the bonding area BA.

Referring to FIG. 11, since the second adhesive member 1182 is not disposed in the bonding area BA, the first cover 110 and the second cover 170 are spaced apart from each other so as not to be fixed in the bonding area BA. That is, in the bonding area BA, the first cover 110 and the second cover 170 are not bonded by the second adhesive member 1182 so that there is a space between the first cover 110 and the second cover 170, and the first cover 110 and the second cover 170 in the bonding area BA are not fixed to each other.

In the display device 1100 according to another exemplary embodiment of the present disclosure, the second adhesive member 1182 is disposed in an area between the first cover 110 and the second cover 170 excluding the bonding area BA. Therefore, when the display device 1100 is wound, the separation of the display panel 120 from the first cover 110 or the separation of the flexible film 130 from the display panel 120 may be improved. Specifically, when the second adhesive member 1182 is disposed in an area between the first cover 110 and the second cover 170 excluding the bonding area BA, if the display device 1100 corresponding to the bonding area BA is wound around the roller 151, the second cover 170 corresponding to the bonding area BA is wound around the roller 151. However, the first cover 110 and the display panel 120 corresponding to the bonding area BA may be wound around the roller 151 while maintaining a flat state in a floated state from the second cover 170. That is, since the first cover 110 and the second cover 170 are not fixed to each other in the bonding area BA, the second cover 170 disposed in the bonding area BA is wound around the roller 151 along the surface of the roller 151. However, the first cover 110 disposed in the bonding area BA may be wound around the roller 151 while being spaced apart from the second cover 170 in a flat state so as not to correspond to the surface of the roller 151. Therefore, in the display device 1000 according to another exemplary embodiment of the present disclosure, since the first cover 110 in the bonding area BA is not fixed to the second cover 170, when the display device 1100 corresponding to the bonding area BA is wound around the roller 151, the first cover 110 and the display panel 120 may maintain a flat state. Therefore, a possibility of the separation of the display panel 120 from the first cover 110 and the separation of the flexible film 130 from the display panel 120 may be very low. Further, since the first cover 110 supports the display panel 120, the pad of the display panel 120 or the pad of the flexible film 130, various wiring lines, and the inorganic layers disposed in the bonding area BA may not be damaged. Therefore, the problem of the driving failure of the display device 1100 may be solved.

When the display device 1100 corresponding to the bonding area BA is wound and then the display device 1100 is wound again, the first cover 110 and the display panel 120 which are disposed to be spaced apart from the second cover 170 and be floated are pressed by the second cover 170 which is further wound one more time to be wound around the roller 151. Therefore, even though the second adhesive member 1182 is not disposed in the bonding area BA, the separation of the display panel 120 from the first cover 110 and the separation of the flexible film 130 from the display panel 120 may be reduced, which may result in the reduction of the damage of the display panel 120.

In some exemplary embodiments, the first adhesive member 181 may be not disposed in the bonding area BA between the display panel 120 and the first cover 110. Therefore, since the display panel 120 in the bonding area BA is not fixed to the first cover 110, when the display device 1100 corresponding to the bonding area BA is wound around the roller 151, the display panel 120 may maintain the flat state. Therefore, the possibility of the separation of the flexible film 130 from the display panel 120 may become very low.

Heat Radiating Function of Second Cover

Figure 12:
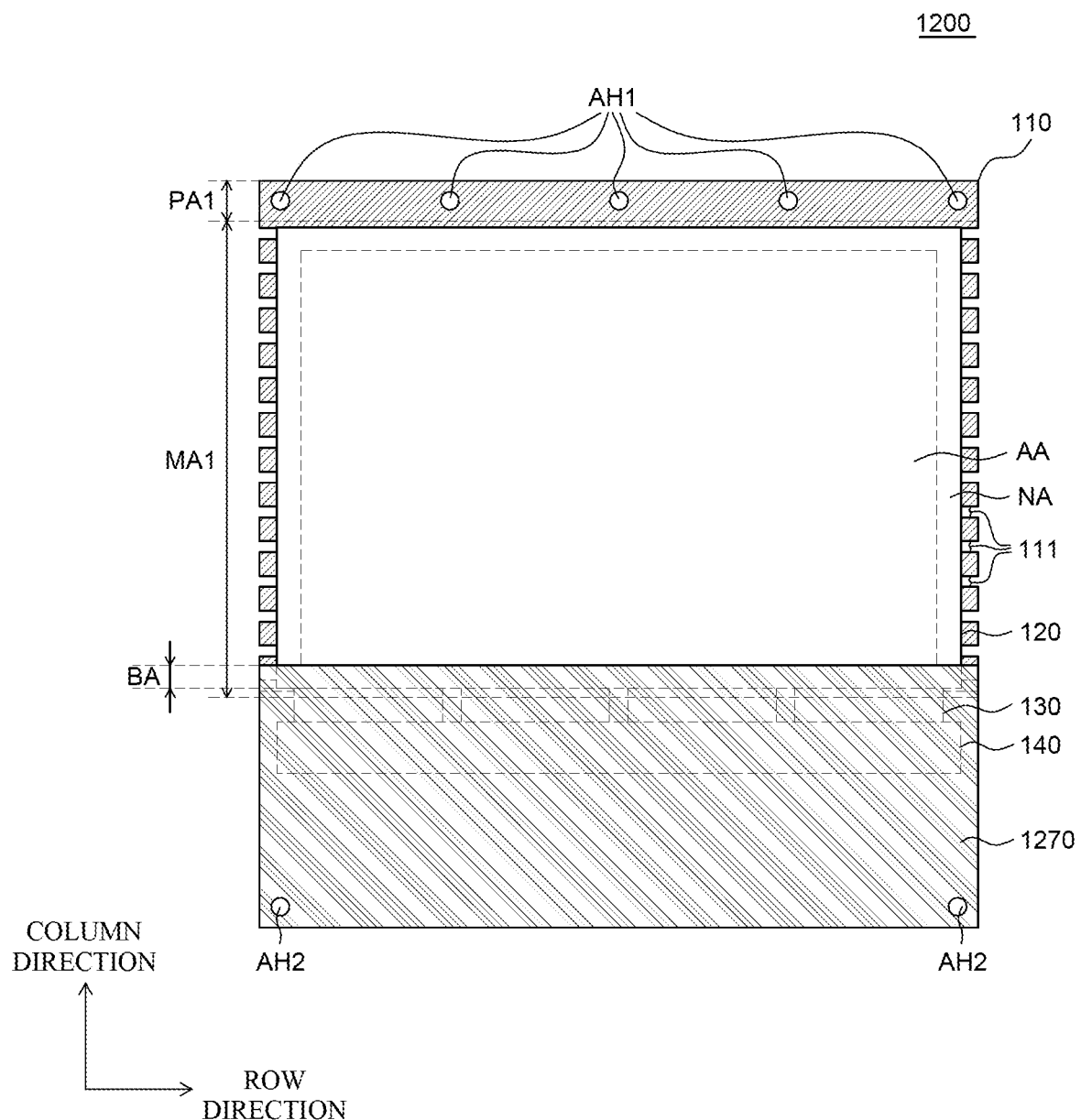
FIG. 12 is a plan view of a display device according to still another exemplary embodiment of the present disclosure.
Figure 13:
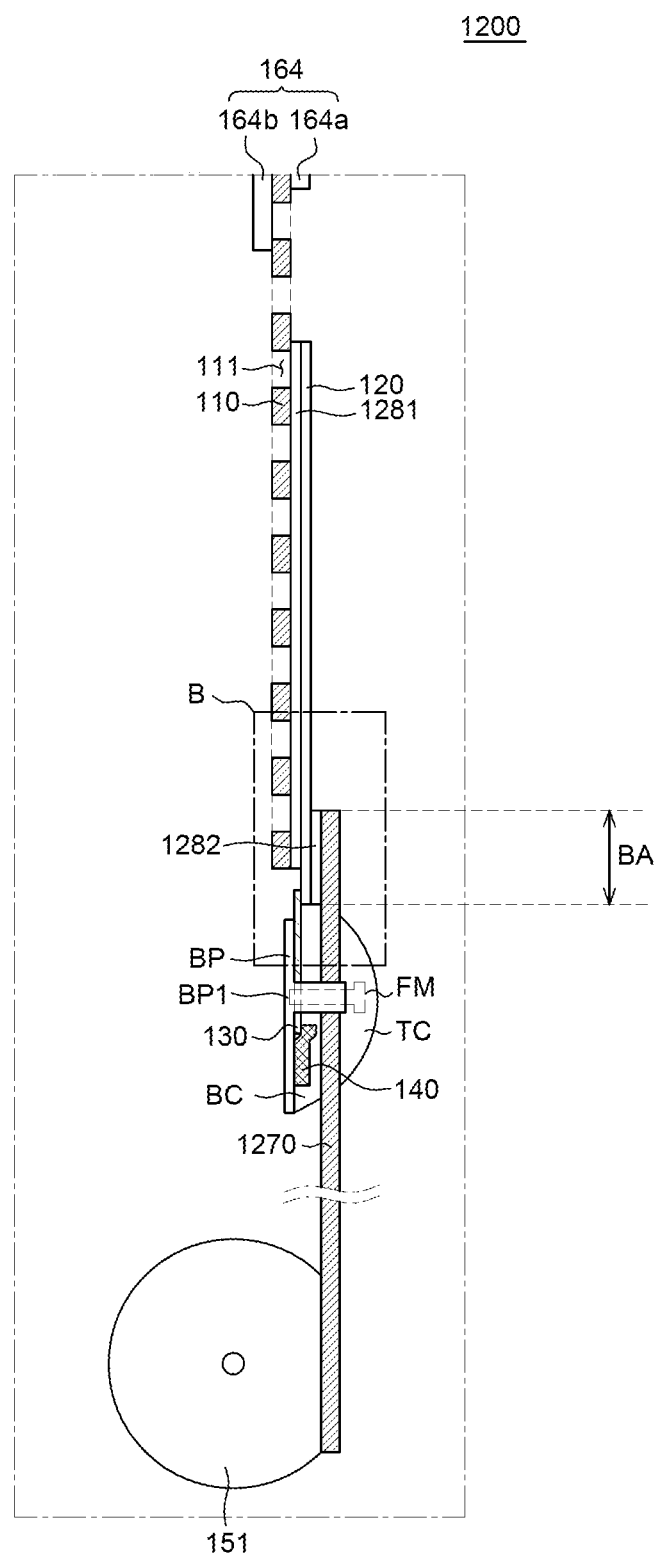
FIG. 13 is a cross-sectional view of a display device according to still another exemplary embodiment of the present disclosure.
Figure 14:
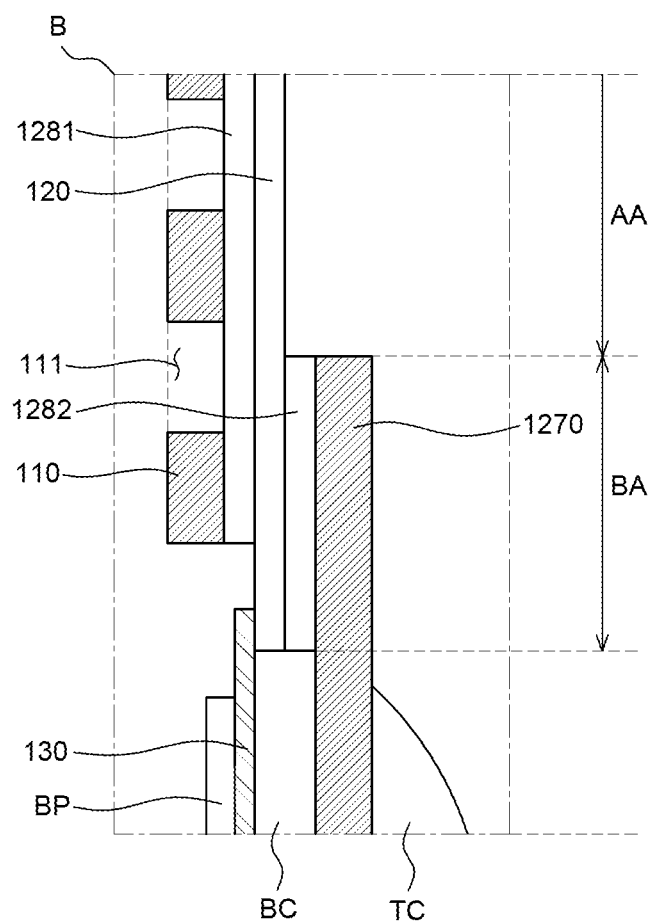
FIG. 14 is an enlarged view of an area B of FIG. 13.

FIG. 12 is a plan view of a display device according to still another exemplary embodiment of the present disclosure. FIG. 13 is a cross-sectional view of a display device according to still another exemplary embodiment of the present disclosure. FIG. 14 is an enlarged view of an area B of FIG. 13. The only difference between the display device 1200 of FIGS. 12 to 14 and the display device 100 of FIGS. 1 to 9 is a first adhesive member 1281, a second cover 1270, and a second adhesive member 1282, but other configuration is substantially the same, so that a redundant description will be omitted.

Referring to FIGS. 12 to 14, the second cover 1270 is disposed on the display panel 120. That is, the second cover 1270 is disposed on an opposite surface of one surface of the display panel 120 on which the first cover 110 is disposed. In this case, the second cover 1270 is fixed to the roller 151 and extends from a portion fixed to the roller 151 to overlap the bonding area BA of the non-display area NA of the display panel 120. The second cover 1270 does not include other opening except for the second fastening hole AH2 to be fixed to the roller 151.

The second cover 1270 may be formed of a heat radiating material. Specifically, the bonding area BA of the non-display area NA of the display panel 120 where the wiring lines are concentrated and the flexible film 130 is bonded may generate heat when the display device 1200 is driven. Therefore, in the bonding area BA of the non-display area NA of the display panel 120, the second cover 1270 which is formed of a heat radiating material is disposed to radiate the heat generated in the display device 1200. For example, the second cover 1270 may be formed of a metal material such as aluminum (Al), copper (Cu), or nickel (Ni) or an alloy including a metal material such as aluminum (Al), copper (Cu), nickel (Ni), or silver (Ag).

Referring to FIGS. 13 and 14, the second adhesive member 1282 is disposed between the display panel 120 and the second cover 1270 to bond the display panel 120 and the second cover 1270. In this case, the second adhesive member 1282 is disposed in an area where the display panel 120 and the second cover 1270 overlap each other.

The second adhesive member 1282 may be an adhesive layer in which heat radiating particles are dispersed. Specifically, the second adhesive member 1282 is disposed between the second cover 1270 which performs a heat radiating function and the display panel 120 so that the second adhesive member 1282 may be formed of a material advantageous for the heat radiation together with the second cover 1270. For example, the second adhesive member 1282 may be an adhesive layer in which metal particles such as aluminum (Al), silver (Ag), copper (Cu), or nickel (Ni) or ceramic particles such as aluminum nitride (AlN), aluminum oxide ($Al_2O_3$), boron nitride (BN), silicon carbide (SiC), or beryllium oxide (BeO) are dispersed.

Referring to FIGS. 13 and 14, the first adhesive member 1281 may not cover the flexible film 130. That is, the first adhesive member 1281 is disposed in the bonding area BA, but does not overlap the flexible film 130. Further, the first adhesive member 1281 may not be disposed in the bonding area BA.

Generally, heat is generated in an area where the wiring lines are concentrated, for example, in the bonding area of the non-display area of the display panel so that the temperature of the display device is increased. However, when the substrate is formed of a plastic material, the heat generated in the display device may not be sufficiently radiated to the outside. Therefore, when the heat generated in the display device is not sufficiently radiated to the outside, the display element of the display panel is damaged due to the heat, which may result in a dark spot of the display panel.

Therefore, in the display device 1200 according to still another exemplary embodiment of the present disclosure, the second cover 1270 is configured to be formed of a heat radiating material, to effectively radiate heat generated in the display device 1200. Specifically, the second cover 1270 is formed of the metal or an alloy material to radiate heat and the bonding area BA and the second cover 1270 are disposed to overlap, so that the heat generated in the bonding area BA may be effectively radiated. Accordingly, the heat generated in the display device 1200 is radiated through the second cover 1270 to lower the temperature of the display device 1200 so that damage of the display element and the display panel 120 may be minimized.

Further, in the display device 1200 according to still another exemplary embodiment of the present disclosure, the second adhesive member 1282 in which the heat radiating particles are dispersed is used to allow the display device 1200 to more effectively radiate the heat. Specifically, the second adhesive member 1282 is disposed between the display panel 120 and the second cover 1270. In this case, the second adhesive member 1282 is configured to include heat radiating particles to perform the heat radiating function together with the second cover 1270 and thus the heat generated in the display device 1200 may be effectively radiated.

Further, in the display device 1200 according to still another exemplary embodiment of the present disclosure, the second cover 1270 is disposed on an opposite surface of the surface of the display panel 120 on which the first cover 110 is disposed to improve the separation of the flexible film 130 from the display panel 120 when the display device 1200 is wound. Specifically, when the second cover 1270 is wound around the roller 151, the display panel 120 and the flexible film 130 are disposed inside the second cover 1270. Therefore, a compressive stress is applied to the display panel 120 and the flexible film 130, rather than the tensile stress, so that the separation of the display panel 120 from the flexible film 130 may be improved. Further, when the second cover 1270 is wound around the roller 151, the second cover may be wound around the roller 151 while pressing the display panel 120 and the flexible film 130 disposed between the second cover 1270 and the roller 151, so that the separation of the display panel 120 from the flexible film 130 may be improved.

Further, as described above, since the compressive stress is applied to the display panel 120 and the flexible film 130, rather than the tensile stress, the pad of the display panel 120 or the pad of the flexible film 130, various wiring lines, and the inorganic layers disposed in the bonding area BA may not also be damaged. Therefore, in the display device 1200 according to still another exemplary embodiment of the present disclosure, the separation of the flexible film 130 from the display panel 120 may be minimized and the damage of the pads, the wiring lines, the inorganic layers, and the like disposed in the bonding area BA is suppressed. As a result, it is possible to solve the problem of the driving failure of the display device 1200.

Second Cover Disposed in Driving Circuit Area

Figure 15:
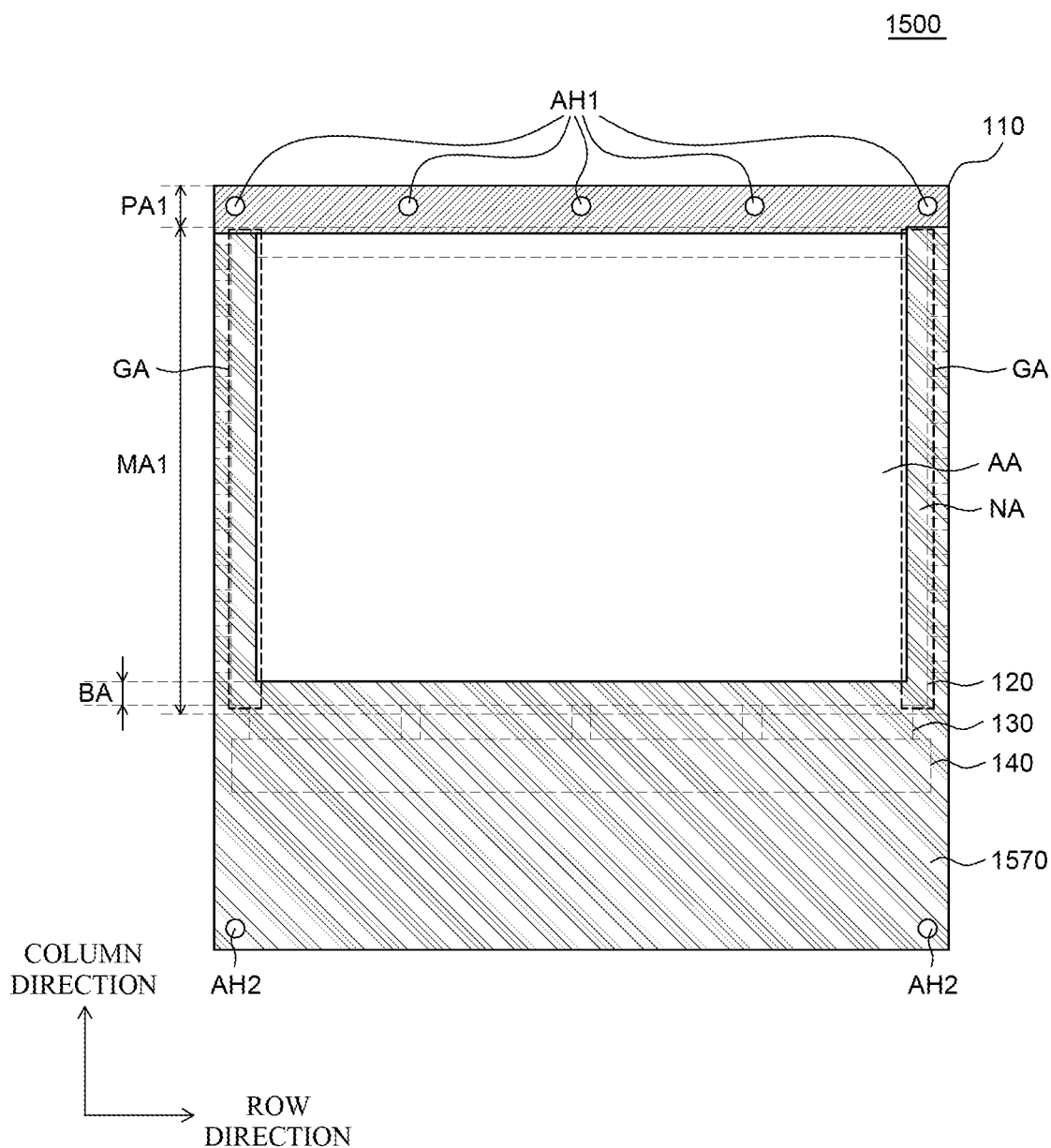
FIG. 15 is a plan view of a display device according to still another exemplary embodiment of the present disclosure.

FIG. 15 is a plan view of a display device according to still another exemplary embodiment of the present disclosure. The only difference between a display device 1500 of FIG. 15 and the display device 1200 of FIGS. 12 to 14 is a second cover 1570, but other configuration is substantially the same, so that a redundant description will be omitted.

Referring to FIG. 15, the non-display area NA of the display panel 120 may further include driving circuit areas GA defined at both sides of the display area AA. In the driving circuit area GA, various driving circuits and wiring lines for driving the plurality of pixels of the display area AA may be disposed. For example, in the driving circuit area GA, a gate driver which outputs a signal such as a scan signal or an emission control signal to a gate line or an emission control signal line and various wiring lines connected to the gate driver may be disposed. Further, the gate driver of the driving circuit area GA may be mounted on the substrate in a gate-driver in panel (GIP) manner, but is not limited thereto. Further, even though in FIG. 15, the driving circuit areas GA are defined at both sides of the display area AA, the driving circuit area GA may be defined to be located at any one of both sides of the display area AA.

Referring to FIG. 15, the second cover 1570 extends from the bonding area BA to further overlap the driving circuit area GA. In this case, a portion of the second cover 1570 which overlaps the driving circuit area GA may also overlap both edges of the first back cover 110. Further, the second adhesive member is disposed between a portion of the second cover 1570 which overlaps the driving circuit area GA of the display panel 120 and the display panel 120 to improve heat radiation.

In the display device 1500 according to still another exemplary embodiment of the present disclosure, the second cover 1570 is disposed to overlap the driving circuit area GA in which various wiring lines and the driving circuit are disposed to more efficiently radiate the heat generated in the display device 1500. When the display device 1500 is driven, the heat is generated not only in the bonding area BA of the display panel 120, but also in the driving circuit areas GA at both sides of the display panel 120. In this case, when the heat generated in the display device 1500 is not radiated, the display element may be deteriorated due to the heat to be damaged and thus a dark spot may be generated in the display panel 120. Accordingly, in the display device 1500 according to still another exemplary embodiment of the present disclosure, the second cover 1570 is disposed to overlap the driving circuit area GA to effectively radiate heat generated in the driving circuit area GA.

Second Cover Including Plurality of Openings

Figure 16:
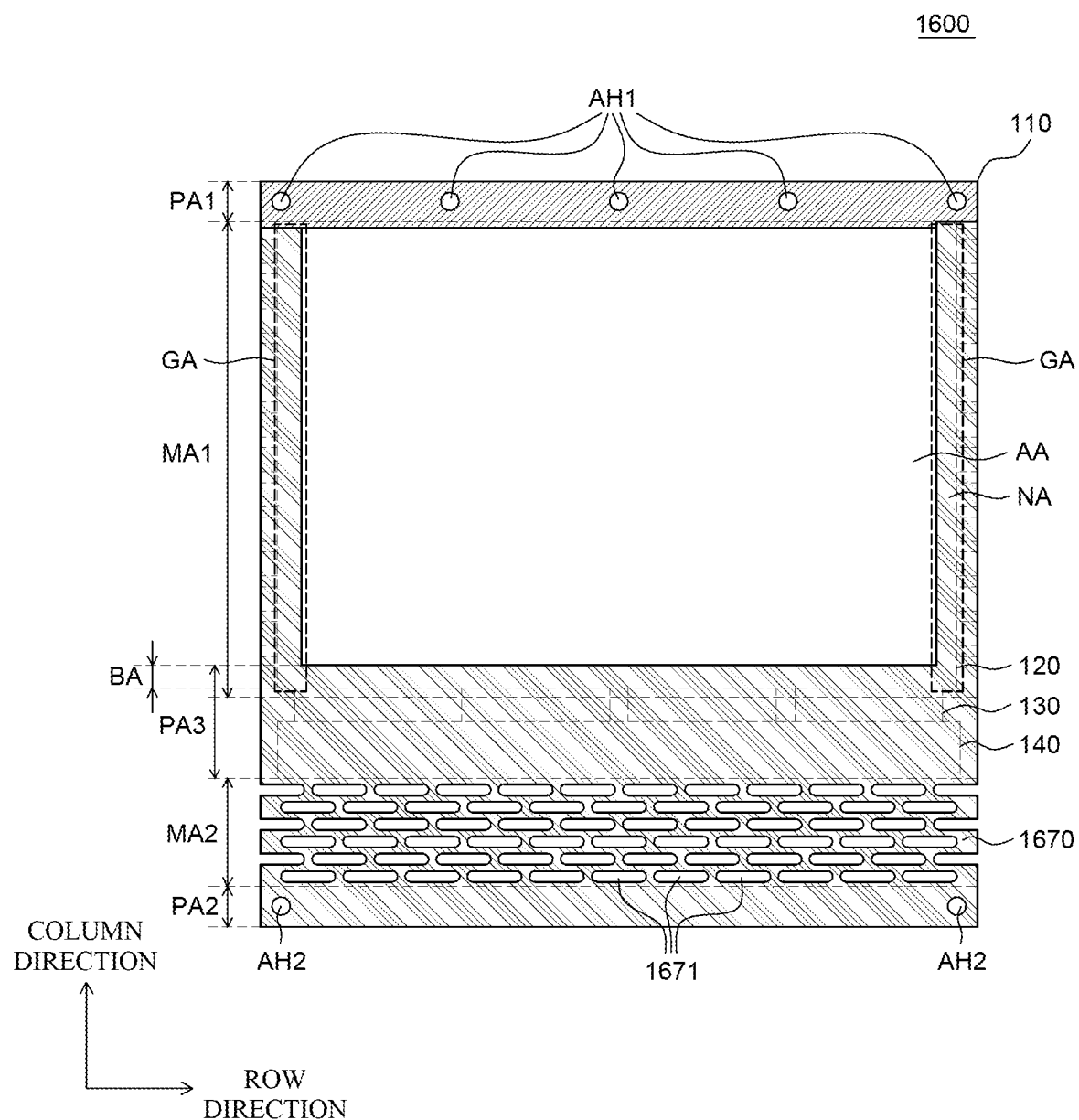
FIG. 16 is a plan view of a display device according to still another exemplary embodiment of the present disclosure.

FIG. 16 is a plan view of a display device according to still another exemplary embodiment of the present disclosure. The only difference between a display device 1600 of FIG. 16 and the display device 1500 of FIG. 15 is a second cover 1670, but other configuration is substantially the same, so that a redundant description will be omitted.

Referring to FIG. 16, the second cover 1670 includes a third support area PA3, a second malleable area MA2, and a second support area PA2. Further, the third support area PA3 of the second cover 1670 may be disposed so as to overlap the bonding area BA of the non-display area NA of the display panel 120.

The second malleable area MA2 of the second cover 1670 includes a plurality of openings 1671. Specifically, the plurality of openings 1671 may allow the second cover 1670 to have flexibility. The plurality of openings 1671 may be flexibly deformed and allow the second cover 1670 to be wound around the roller 151 or unwound from the roller 151. The plurality of openings 1671 of the second cover 1670 is substantially the same as the plurality of openings 171 of the second cover 170 of the display device 100 which has been described with reference to FIGS. 1 to 9, so that the detailed description will be omitted.

In the display device 1600 according to still another exemplary embodiment of the present disclosure, the second cover 1670 includes a plurality of openings 1671 so that the heat radiation is effective and the rolling property of the display device 1600 may be improved. Specifically, when the display device 1600 is wound, a stress is generated in the second cover 1670. In this case, when the plurality of openings 1671 is disposed in the second cover 1670, the plurality of openings 1671 may easily extend in the column direction and the stress applied to the second cover 1670 may be relieved. Therefore, the plurality of openings 1671 is disposed in the second cover 1670 to radiate the heat generated in the display device 1600 and improve the rolling property of the display device 1600.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
a display panel including a display area having a plurality of pixels and a non-display area;
a first cover coupled to the display panel, the first cover including a plurality of first openings through the first cover;
a second cover coupled to the first cover or the display panel, the second cover including a plurality of second openings through the second cover, the second cover at least partially overlapping the non-display area of the display panel and the first cover; and
a roller coupled to the second cover.

2. The display device according to claim 1, further comprising:
one or more flexible films electrically connected to the display panel; and
one or more printed circuit boards electrically connected to the one or more flexible films;
wherein the one or more printed circuit boards are fixed to the second cover.

3. The display device according to claim 1, wherein:
the first cover includes a first support area and a first malleable area adjacent to the first support area, wherein the display panel is coupled to the first malleable area; and
the second cover at least partially overlaps the first malleable area of the first cover on a surface of the first cover opposite to the display panel.

4. The display device according to claim 1, further comprising:
an adhesive member disposed on at least one of the first cover and the second cover, the adhesive member at least partially filling at least one of the plurality of first openings and the plurality of second openings.

5. A display device, comprising:
a display panel including a plurality of pixels;
a first cover coupled to the display panel;
a second cover coupled to the first cover or the display panel;
a roller coupled to the second cover;
a first adhesive member bonding the display panel to the first cover; and
a second adhesive member bonding the first cover to the second cover.

6. The display device according to claim 5, further comprising:
one or more flexible films electrically connected to the display panel in a bonding area of the display panel;
wherein the first adhesive member spans an entire area between the display panel, other than the bonding area of the display panel, and the first cover.

7. The display device according to claim 6, wherein the second adhesive member is located between the first cover and the second cover and does not overlap the bonding area.

8. A display device, comprising:
a display panel including a plurality of pixels;
a first cover coupled to the display panel;
a second cover coupled to the first cover or the display panel; and
a roller coupled to the second cover,
the first cover includes a first support area and a first malleable area adjacent to the first support area, wherein the display panel is coupled to the first malleable area of the first cover;
the display panel includes a display area and a non-display area outside of the display area, and
the second cover at least partially overlaps the non-display area of the display panel on a surface of the display panel opposite to the first cover.

9. The display device according to claim 8, wherein:
the non-display area includes a bonding area and one or more flexible films are bonded to the bonding area, and
the second cover overlaps the bonding area.

10. The display device according to claim 9, further comprising:
a first adhesive member that attaches the display panel to the first cover;
wherein the first adhesive member and the first cover are coupled to a portion of the display panel outside the bonding area of the non-display area of the display panel.

11. The display device according to claim 9, further comprising:
a second adhesive member that attaches the display panel to the second cover;
wherein the second adhesive member is an adhesive layer that includes metal or ceramic particles.

12. The display device according to claim 9, wherein:
the non-display area further includes a driving circuit area adjacent to the bonding area, wherein the driving circuit area includes a driving circuit; and
the second cover overlaps the driving circuit area.

13. The display device according to claim 8, wherein:
the second cover includes a second support area fixed to the roller and a second malleable area adjacent to the second support area; and
the second malleable area includes the plurality of second openings.

14. A display device, comprising:
a display panel configured to display images;
one or more flexible films electrically connected to the display panel;
a first cover attached to a rear surface of the display panel;
a second cover attached to a rear surface of the first cover or to a front surface of the display panel, wherein the second cover overlaps a location where the display panel and the one or more flexible films are connected; and
a roller configured to wind and unwind the display panel, the first cover, and the second cover about the roller.

15. The display device according to claim 14, wherein:
the display panel includes a display area and a non-display area at the outside of the display area;
the non-display area includes a bonding area;
the flexible film is bonded to the non-display area of the display panel; and
the second cover overlaps the bonding area.

16. The display device according to claim 15, further comprising:
a first adhesive member that attaches the display panel to the first cover; and
a second adhesive member that attaches the display panel to the second cover;
wherein the second cover is coupled to a surface of the display panel opposite to the first cover.

17. The display device according to claim 16, wherein the second adhesive member is an adhesive layer that includes heat radiating particles.

18. The display device according to claim 14, wherein the second cover is formed of a metal material selected from a group of metal materials consisting of: aluminum, copper, nickel, an alloy including aluminum, an alloy including copper, an alloy including nickel, and an alloy including silver.

19. A display device, comprising:
a display panel configured to display images;
one or more flexible films electrically connected to the display panel;
a first cover attached to a rear surface of the display panel;
a second cover attached to a rear surface of the first cover or to a front surface of the display panel, wherein the second cover overlaps a location where the display panel and the flexible film are connected;
a roller configured to wind and unwind the display panel, the first cover, and the second cover;
a first adhesive member that attaches the display panel to the first cover; and
a second adhesive member that attaches the second cover to the first cover,
wherein the second cover is coupled to a surface of the first cover opposite to the display panel,
the display panel includes a display area and a non-display area outside of the display area,
the non-display area includes a bonding area,
the flexible film is bonded to the non-display area of the display panel, and
the second cover overlaps the bonding area.

20. The display device according to claim 19, wherein the second adhesive member does not contact the bonding area.

21. A rollable display device, comprising:
a rollable display panel;
a first cover coupled to a rear surface of the rollable display panel, wherein the first cover includes a malleable portion, the malleable portion of the first cover including a first plurality of openings through the first cover;
a printed circuit board coupled to the rollable display panel;
a second cover coupled to the rollable display panel or to the first cover wherein the second cover overlaps the printed circuit board; and
an adhesive member coupled to at least one of the first cover and the second cover.

22. The rollable display device of claim 21 wherein the second cover overlaps the printed circuit board along an axis extending from a front end of the rollable display device to a rear end of the rollable display device.

23. The rollable display device of claim 21 wherein the second cover includes a first malleable portion of the second cover including a second plurality of openings, a second malleable portion of the second cover including a third plurality of openings, and a support portion located between the first malleable portion of the second cover and the second malleable portion of the second cover, wherein the printed circuit board is attached to the support portion of the second cover.

24. The rollable display device of claim 23 wherein the malleable portion of the first cover overlaps the first malleable portion of the second cover.

25. The rollable display device of claim 21 wherein the rollable display panel is attached to the malleable portion of the first cover.

26. The rollable display device of claim 21 wherein the first cover is configured to structurally support the rollable display panel and the second cover is configured to structurally support the rollable display panel and the printed circuit board.

27. The rollable display device of claim 21 wherein the second cover is a heat-radiating material.

28. The rollable display device of claim 27 wherein the heat-radiating material includes a material selected from the group consisting of: aluminum, copper, nickel, and silver.

29. The rollable display device of claim 21 wherein the rollable display panel includes a bonding portion of the rollable display panel where a flexible film is bonded to the rollable display panel, and the second cover is coupled to a front surface of the bonding portion of the rollable display panel.

30. The rollable display device of claim 21 wherein the second cover is coupled to the rollable display panel by an adhesive including particles of a heat radiating material.

* * * * *